United States Patent
Jung et al.

(10) Patent No.: US 10,541,033 B2
(45) Date of Patent: Jan. 21, 2020

(54) NON-VOLATILE MEMORY DEVICE AND MEMORY SYSTEM INCLUDING THE SAME AND PROGRAM METHOD THEREOF

(71) Applicant: SAMSUNG ELECTRONICS CO., LTD., Suwon-si, Gyeonggi-do (KR)

(72) Inventors: Won-Taeck Jung, Hwaseong-si (KR); Sang-Wan Nam, Hwaseong-si (KR); Jinwoo Park, Yongin-si (KR); Jaeyong Jeong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 3 days.

(21) Appl. No.: 15/911,208

(22) Filed: Mar. 5, 2018

(65) Prior Publication Data
US 2018/0374541 A1    Dec. 27, 2018

(30) Foreign Application Priority Data
Jun. 26, 2017  (KR) .................. 10-2017-0080521

(51) Int. Cl.
| | | |
|---|---|---|
| *G11C 16/10* | (2006.01) | |
| *G11C 16/20* | (2006.01) | |
| *G11C 16/08* | (2006.01) | |
| *G11C 16/34* | (2006.01) | |
| *G11C 16/04* | (2006.01) | |
| *H01L 27/11582* | (2017.01) | |
| *H01L 27/11524* | (2017.01) | |
| *H01L 27/1157* | (2017.01) | |
| *H01L 27/11556* | (2017.01) | |

(52) U.S. Cl.
CPC .......... *G11C 16/20* (2013.01); *G11C 16/0483* (2013.01); *G11C 16/08* (2013.01); *G11C 16/3427* (2013.01); *H01L 27/1157* (2013.01); *H01L 27/11524* (2013.01); *H01L 27/11556* (2013.01); *H01L 27/11582* (2013.01)

(58) Field of Classification Search
CPC .................................................. G11C 16/0483
USPC .................................................... 365/185.18
See application file for complete search history.

(56) References Cited

U.S. PATENT DOCUMENTS

| | | |
|---|---|---|
| 7,848,144 B2 | 12/2010 | Lasser |
| 7,924,629 B2 | 4/2011 | Park et al. |
| 7,952,929 B2 | 5/2011 | Kim et al. |
| 8,902,661 B1 | 12/2014 | Raghu et al. |
| 9,025,383 B2 | 5/2015 | Nam et al. |
| 9,385,131 B2 | 7/2016 | Beaudoin et al. |
| 9,390,803 B2 | 7/2016 | Shim et al. |

(Continued)

*Primary Examiner* — Min Huang
(74) *Attorney, Agent, or Firm* — Volentine, Whitt & Francos, PLLC

(57) ABSTRACT

A three-dimensional (3D) nonvolatile memory device includes a cell string. The cell string includes a pillar structure comprising a ground selection transistor, a plurality of memory cells, and a string selection transistor stacked vertically over a substrate. The memory cells comprise a first cell group and a second cell group stacked on the first cell group, and a horizontal width of at least a portion of the pillar structure decreases in a depth direction towards the substrate. A method of programming the memory device includes initializing a channel of a memory cell of the first cell group of the cell string through the ground selection transistor of the pillar structure, and then applying a program voltage to the memory cell of the pillar structure of the cell string.

20 Claims, 26 Drawing Sheets

(56) References Cited

U.S. PATENT DOCUMENTS

| | | |
|---|---|---|
| 9,543,022 B2 | 1/2017 | Hashimoto et al. |
| 9,564,219 B2 | 2/2017 | Magia et al. |
| 9,589,647 B1 * | 3/2017 | Ahn ........................ G11C 16/10 |
| RE46,573 E * | 10/2017 | Sharon ................. G11C 11/5642 |
| 2011/0019486 A1 * | 1/2011 | Jang ................... G11C 16/0483 |
| | | 365/185.25 |
| 2012/0287710 A1 | 11/2012 | Shirakawa |
| 2013/0235667 A1 * | 9/2013 | Nam .................. G11C 16/0483 |
| | | 365/185.17 |
| 2013/0250677 A1 | 9/2013 | Nam et al. |
| 2015/0380093 A1 * | 12/2015 | Shim .................. G11C 16/0483 |
| | | 365/185.11 |
| 2016/0211027 A1 * | 7/2016 | Kim ....................... G11C 16/10 |
| 2017/0069390 A1 | 3/2017 | Nam et al. |

\* cited by examiner

< ADDR Scramble 6 >

< Program Operation 1 >

< Program Operation 2 >

< Program Operation 4 >

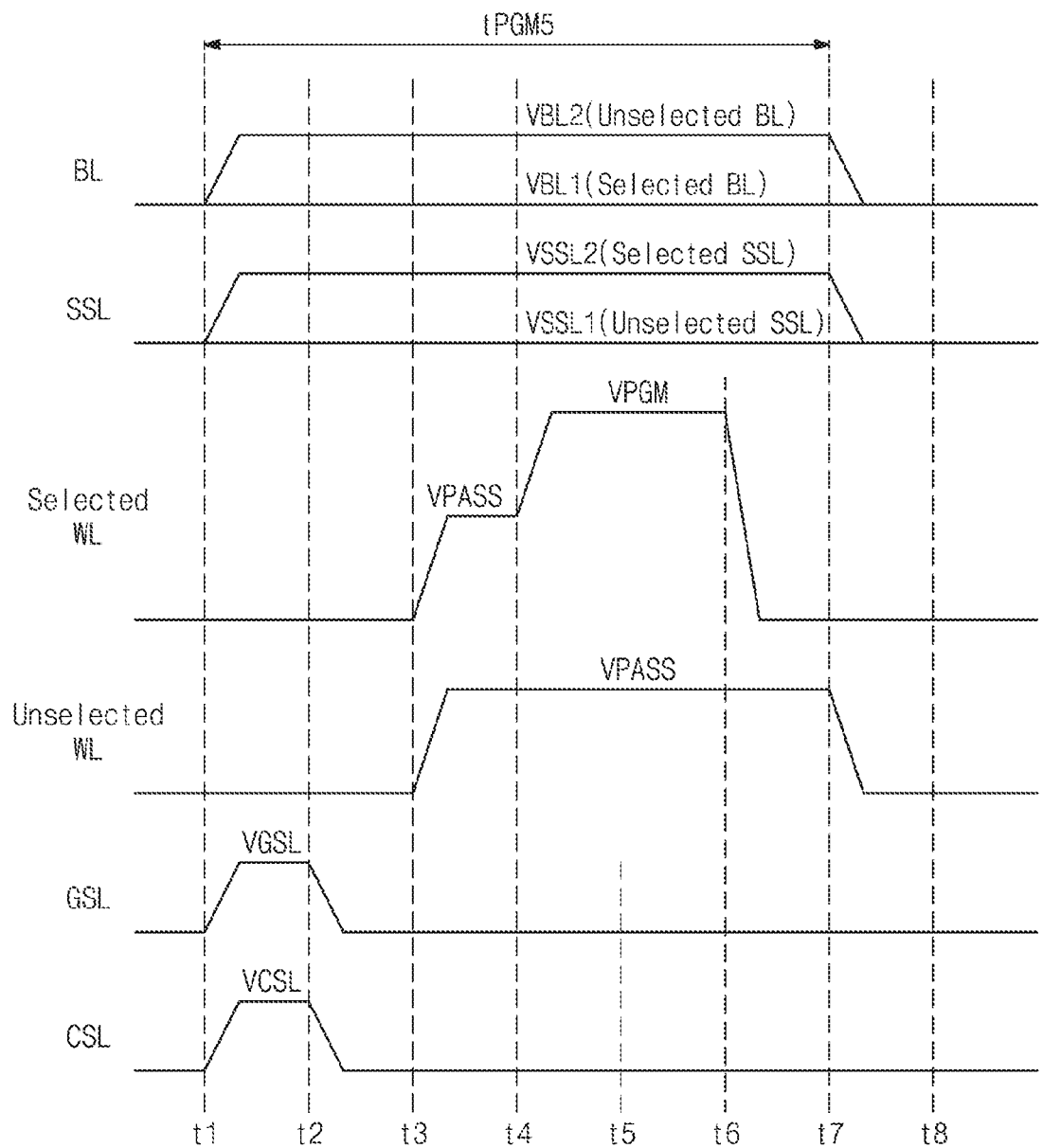

FIG. 10

| Order of Program | ADDR Scramble 1 | ADDR Scramble 2 | ADDR Scramble 3 | ADDR Scramble 4 | ADDR Scramble 5 | ADDR Scramble 6 |
|---|---|---|---|---|---|---|
| WL1 | Program Operation 2 | Program Operation 1 | | | | |
| WL2 | | Program Operation 1 | | | | |
| WL3 | | Program Operation 1 | | | | |
| ... | | | | | | |
| WLm-1 | | | Program Operation 1 | | | |
| WLm | | | Program Operation 1 | | | |
| WLm+1 | | | Program Operation 2 | Program Operation 2 | Program Operation 2 | Program Operation 2 |
| ... | | | | | | |
| WLn-2 | | | | Program Operation 1 | Program Operation 1 | |
| WLn-1 | | | | | Program Operation 1 | |
| WLn | | | | | | |

FIG. 11

| Order of Program | ADDR Scramble 1 | ADDR Scramble 2 | ADDR Scramble 3 | ADDR Scramble 4 | ADDR Scramble 5 | ADDR Scramble 6 |
|---|---|---|---|---|---|---|
| WL1 | Program Operation 2 | Program Operation 1 | Program Operation 1 | Program Operation 2 | Program Operation 2 | Program Operation 2 |
| WL2 | | | | | | |
| WL3 | | | | | | |
| ... | | | | | | |
| WLg-1 | | | | | | |
| WLg | | | | Program Operation 3 | Program Operation 3 | |
| WLg+1 | | | Program Operation 2 | | | |
| ... | | | | | | |
| WLm-1 | | | | | | |
| WLm | | | Program Operation 3 | | | |
| WLm+1 | Program Operation 3 | | | Program Operation 1 | Program Operation 1 | Program Operation 3 |
| ... | | | | | | |
| WLh-1 | | | | | | |
| WLh | | | | | | |
| WLh+1 | | | | | | |
| ... | | | | | | |
| WLn-2 | | | | | | |
| WLn-1 | | | | | | |
| WLn | | | | | | |

FIG. 12

| Order of Program | ADDR Scramble 3 | ADDR Scramble 4 | ADDR Scramble 5 |
|---|---|---|---|
| WL1 | Bit Reduction Program Operation | | |
| WL2 | Program Operation 1 | Program Operation 2 | Program Operation 2 |
| WL3 | | | |
| ⋮ | | | |
| WLm-1 | | | |
| WLm | | | |
| WLm+1 | Program Operation 2 | Program Operation 1 | Program Operation 1 |
| ⋮ | | | |
| WLn-2 | | | |
| WLn-1 | | | |
| WLn | | | |

FIG. 13

| Program Loop | ADDR Scramble 1 | ADDR Scramble 3 | | ADDR Scramble 4 | | ADDR Scramble 6 |
|---|---|---|---|---|---|---|
| | WL1~WLn | WL1~WLm | WLm+1~WLn | WL1~WLm | WLm+1~WLn | WL1~WLn |
| LOOP1 | Program Operation 2 | Program Operation 1 | Program Operation 2 | Program Operation 2 | Program Operation 1 | Program Operation 2 |
| LOOP2 | | | | | | |
| LOOP3 | | | | | | |
| ... | | | | | | |
| LOOPm-1 | | | | | | |
| LOOPm | | | | | | |
| LOOPm+1 | Program Operation 4 | | Program Operation 4 | Program Operation 4 | | Program Operation 4 |
| ... | | | | | | |
| LOOPn-2 | | | | | | |
| LOOPn-1 | | | | | | |
| LOOPn | | | | | | |

FIG. 14

| Program Loop | ADDR Scramble 1 | | ADDR Scramble 3 | | | ADDR Scramble 4 | | | ADDR Scramble 6 | |
|---|---|---|---|---|---|---|---|---|---|---|
| | WL1~WLm | WLm+1~WLn | WL1~WLm | WLm+1~WLh | WLh+1~WLn | WL1~WLg | WLg+1~WLm | WLm+1~WLn | WL1~WLm | WLm+1~WLn |
| LOOP1 | | | | | | | | | | |
| LOOP2 | | | | | | | | | | |
| LOOP3 | Program Operation 2 | Program Operation 3 | | | | | | | | |
| ... | | | | | | | | | | |
| LOOPm-1 | Program Operation 4 | Program Operation 5 | | | | | | | | |
| LOOPm | | | Program Operation 1 | | | | | | | |
| LOOPm+1 | | | | Program Operation 2 | Program Operation 3 | | | Program Operation 1 | | |
| ... | | | | | | | | | | |
| LOOPn-2 | | | | Program Operation 4 | Program Operation 5 | Program Operation 2 | Program Operation 3 | | Program Operation 2 | Program Operation 3 |
| LOOPn-1 | | | | | | Program Operation 4 | Program Operation 5 | | Program Operation 4 | Program Operation 5 |
| LOOPn | | | | | | | | | | |

NON-VOLATILE MEMORY DEVICE AND MEMORY SYSTEM INCLUDING THE SAME AND PROGRAM METHOD THEREOF

BACKGROUND

Embodiments of the inventive concept disclosed herein relate to a semiconductor memory device, and more particularly, relate to a non-volatile memory device that uses an address scramble scheme based on the size of a channel hole of a stacked memory cell of a cell string.

Semiconductor memory devices are classified into volatile semiconductor memory devices and non-volatile semiconductor memory devices. Volatile semiconductor memory devices are fast in read and write speeds but lose data stored therein when power is not supplied thereto. In contrast, non-volatile semiconductor memory devices retain data stored therein even when power is not supplied thereto. For this reason, non-volatile semiconductor memory devices are used to store information that has to be retained regardless of whether power is supplied thereto.

A flash memory device may be an example of the non-volatile semiconductor memory device. The flash memory device is being used as voice and image data storage media of information devices such as a computer, a cellular phone, a smartphone, a personal digital assistant (PDA), a handheld personal computer (PC), a game console, a facsimile unit, a scanner, and a printer. Recently, a semiconductor memory device with three-dimensionally stacked memory cells is being developed to improve the degree of integration of the semiconductor memory.

A three-dimensional semiconductor memory device may include a cell string that is implemented by stacking memory cells in a direction perpendicular to a substrate to improve the degree of integration. However, there is a need to maintain the reliability of the three-dimensional semiconductor memory device together with improving the degree of integration.

SUMMARY

In one aspect, the present invention provides a method of programming a three-dimensional (3D) nonvolatile memory device including a cell string, the cell string including a pillar structure comprising a ground selection transistor, a plurality of memory cells, and a string selection transistor stacked vertically over a substrate, wherein the memory cells comprise a first cell group and a second cell group stacked on the first cell group, and wherein a horizontal width of at least a portion of the pillar structure decreases in a depth direction towards the substrate. The method comprises: initializing a channel of a memory cell of the first cell group of the cell string through the ground selection transistor of the pillar structure; and the applying a program voltage to the memory cell of the pillar structure of the cell string.

In some embodiments, the method further comprises sequentially executing said initializing and said applying for each of remaining memory cells of the first cell group of the cell string which are to be programmed among the memory cells of the first cell group of the cell string.

In some embodiments, a horizontal width of the pillar structure decreases in the depth direction from the string selection transistor to the ground selection transistor, and the memory cells of the cell string are sequentially programmed in order from an uppermost memory cell furthest from the substrate to a lowermost memory cell closest to the substrate by sequentially executing said initializing and said applying for each of the memory cells of the cell string.

In some embodiments, the horizontal width of the pillar structure for the first cell group of the cell string decreases in the depth direction towards the substrate and the horizontal width of the pillar structure for the second cell group of the cell string increases in the depth direction towards the substrate, and the method further includes: sequentially programming the memory cells of the second cell group in order from a lowermost memory cell of the second cell group closest to the substrate to an uppermost memory cell of the second cell group furthest from the substrate; and then sequentially programming the memory cells of the first cell group in order from an uppermost memory cell of the first cell group furthest from the substrate to a lowermost of the first cell group closest to the substrate.

In some embodiments, a first program operation for sequentially programming the memory cells of the second cell group is different from a second program operation for sequentially programming the memory cells of the first cell group.

In some embodiments, a first program operation for sequentially programming the memory cells of the second cell group is different from a second program operation and a third program operation for sequentially programming the memory cells of the first cell group.

In some embodiments, the horizontal width of the pillar structure for the first cell group decreases in the depth direction towards the substrate and the horizontal width of the pillar structure for the second cell group increases in the depth direction towards the substrate, and the method further includes: sequentially programming the memory cells of the first cell group in order from an uppermost memory cell of the first cell group furthest from the substrate to a lowermost of the first cell group closest to the substrate; and then sequentially programming the memory cells of the second cell group in order from a lowermost memory cell of the second cell group closest to the substrate to an uppermost memory cell of the second cell group furthest from the substrate.

In some embodiments, a first program operation for sequentially programming the memory cells of the second cell group is different from a second program operation for sequentially programming the memory cells of the first cell group.

In some embodiments, a first program operation for sequentially programming the memory cells of the second cell group is different from a second program operation and a third program operation for sequentially programming the memory cells of the first cell group.

In some embodiments, a horizontal width of an uppermost memory cell of the first cell group is greater than a horizontal width of an adjacent lowermost memory cell of the second cell group, and the method further includes: sequentially programming the memory cells of the first cell group in order from the uppermost memory cell of the first cell group furthest from the substrate to a lowermost of the first cell group closest to the substrate; and then sequentially programming the memory cells of the second cell group in order from the lowermost memory cell of the second cell group closest to the substrate to an uppermost memory cell of the second cell group furthest from the substrate.

In some embodiments, a first program operation for sequentially programming the memory cells of the second cell group is different from a second program operation for sequentially programming the memory cells of the first cell group.

In some embodiments, a first program operation for sequentially programming the memory cells of the second cell group is different from a second program operation and a third program operation for sequentially programming the memory cells of the first cell group.

In some embodiments, a horizontal width of an uppermost memory cell of the first cell group is greater than a horizontal width of an adjacent lowermost memory cell of the second cell group, and the method further includes sequentially programming the memory cells of the cell string in order from an uppermost memory cell of the second cell group furthest from the substrate to a lowermost memory cell of the first cell group closest to the substrate by sequentially executing said initializing and said applying for each of the memory cells of the cell string.

In some embodiments, a memory cell having a smallest horizontal width among the memory cells of the first cell group is programmed with fewer bits than a memory cell having a largest horizontal width of the memory cells of the first cell group.

In some embodiments, a memory cell having a smallest horizontal width among the memory cells of the second cell group is programmed with fewer bits than a memory cell having a largest horizontal width of the memory cells of the second cell group.

In some embodiments, the method further includes incremental step pulse programming (ISPP) comprising a plurality of program loops, and a second program operation for programming the memory cell during a first portion of the program loops is different from a fourth program operation for programming the memory cell during a second portion of the program loops, wherein a voltage applied to a common source line of the cell string is different between the second and fourth program operations.

In another aspect, the present invention provides a three dimensional non-volatile memory device. The memory device comprises: a memory cell array including a cell string, the cell string including a pillar structure comprising a ground selection transistor, a plurality of memory cells, and a string selection transistor stacked vertically over a substrate, wherein the memory cells comprise a first cell group and a second cell group stacked on the first cell group, and wherein a horizontal width of at least a portion of the pillar structure decreases in a depth direction towards the substrate; an address decoder configured to a supply string selection line voltage to the string selection transistor, word line voltages to word lines connected to the memory cells, a ground selection line voltages to the ground selection transistor, and a common source line voltage to a common source line of the memory cell array; a page buffer circuit configured to output bit data from selected ones of the memory cells of the memory cell array; control logic; and a voltage generator configured to supply voltages to the address decoder in response to the control logic. The memory device is configured to initialize a channel of a memory cell of the first cell group of the cell string through the ground selection transistor of the pillar structure, and then apply a program voltage to the memory cell of the pillar structure of the cell string.

In yet another aspect, the present invention provides a method of programming a three-dimensional (3D) nonvolatile memory device, including a memory cell array having a plurality of cell strings each connected to one of a plurality of bit lines, the cell strings each including a pillar structure comprising a ground selection transistor, a plurality of memory cells each connected to one of a plurality of word lines, and a string selection transistor stacked vertically over a substrate, wherein the memory cells of each cell string comprise a first cell group and a second cell group stacked on the first cell group, and wherein a horizontal width of at least a portion of the pillar structure decreases in a depth direction towards the substrate. The method comprises: providing bit line voltages to the bit lines to select one of the bit lines; supplying string selection line voltages to string selection transistors of cell strings connected to the selected bit line to select one of the cell strings; and precharging the pillar structure of the selected cell string through the ground selection transistor of the pillar structure, and then applying word line voltages to the word lines connected to the memory cells of the cell string to program a selected memory cell.

BRIEF DESCRIPTION OF THE DRAWINGS

The above and other objects and features will become apparent from the following description with reference to the following figures, wherein like reference numerals refer to like parts throughout the various figures unless otherwise specified.

FIG. 6, FIG. 7, FIG. 8 and FIG. 9 are timing diagrams illustrating program operations according to embodiments of the inventive concept.

FIG. 10, FIG. 11, FIG. 12, FIG. 13 and FIG. 14 are views illustrating program operations applied for the respective address scramble schemes according to embodiments of the inventive concept.

DETAILED DESCRIPTION

Below, embodiments of the inventive concept may be described in detail and clearly to such an extent that an ordinary one in the art easily implements the inventive concept.

Figure 1:
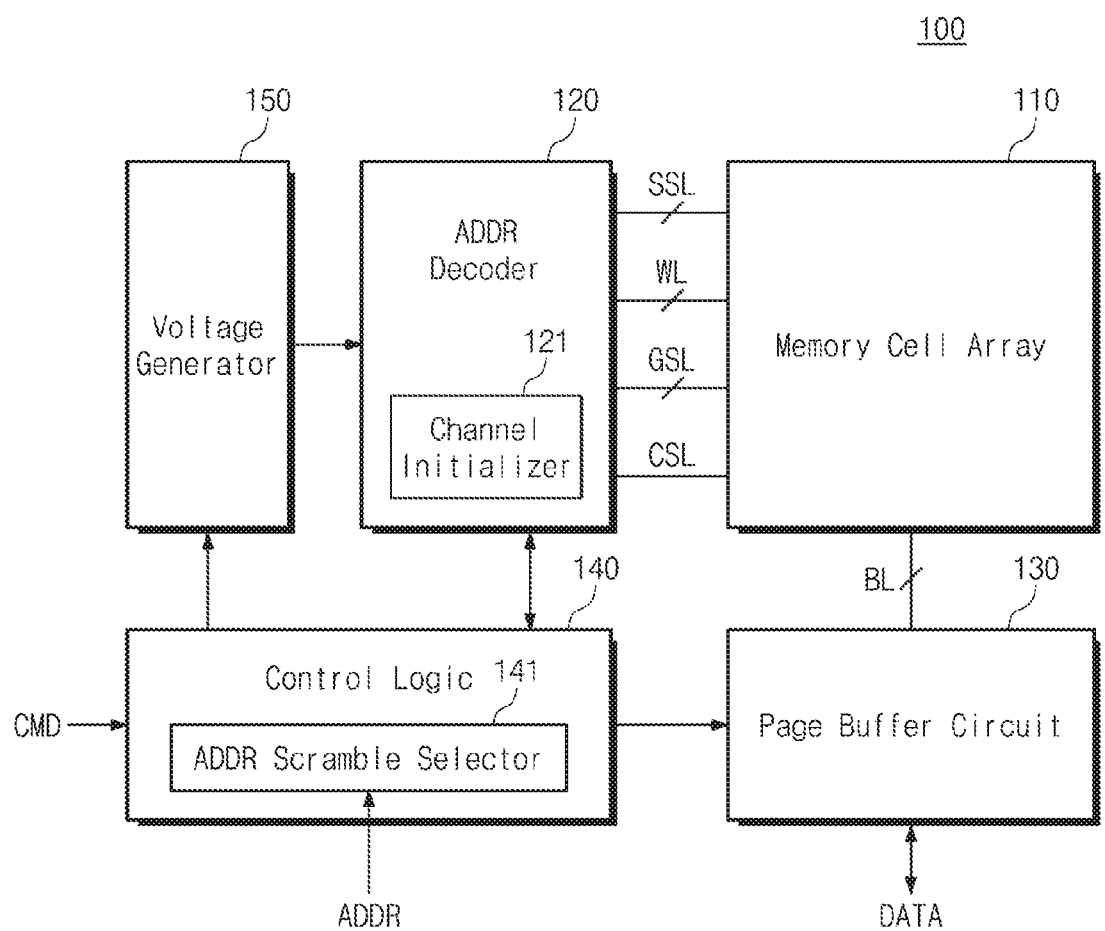
FIG. 1 is a block diagram illustrating a non-volatile memory device according to an embodiment of the inventive concept.

FIG. 1 is a block diagram illustrating a non-volatile memory device 100 according to an embodiment of the inventive concept. Referring to FIG. 1, the non-volatile memory device 100 may include a memory cell array 110, an address decoder 120, a page buffer circuit 130, control logic 140, and a voltage generator 150.

The memory cell array 110 may be connected to the address decoder 120 through word lines WL, selection lines SSL and GSL, and a common selection line CSL. The memory cell array 110 may be connected to the page buffer circuit 130 through bit lines BL. The memory cell array 110 may include a plurality of NAND cell strings. Each of the NAND cell strings may be formed in a direction that is perpendicular to, or in parallel with, a substrate. The word lines of the memory cell array 110 may be stacked in a direction that is perpendicular to the substrate.

During a program operation, a difference in one or more characteristics may occur between memory cells corresponding to stacked word line layers. To stack memory cells in a vertical structure, in general a channel is formed that vertically penetrates word lines by an etching process. For example, in a vertical etching process, if an aspect ratio of a pillar is not great, a diameter of a channel hole may decrease with increasing depth of the channel hole. That is, the sizes of memory cells that respectively correspond to the layers may vary according to the etching process. Accordingly, the size of a tunneling insulating layer or a floating gate of each memory cell may vary according to a channel depth.

Even though the same program voltage is applied to stacked memory cells under the above-described condition, electric fields of different magnitudes may be generated at floating gates of memory cells with different sizes. A relatively great electric field may be formed at a floating gate of a memory cell having a relatively small size compared to the electric field which is formed at a floating gate of a memory cell having a relatively large size under the same program voltage condition. Accordingly, a program speed of a memory cell, the diameter of which is relatively small, may be relatively fast compared to the program speed of a memory cell whose diameter is relatively large.

Meanwhile, when a memory cell is programmed, a program disturbance may occur at a just-previously programmed memory cell. The program disturbance may occur due to charges accumulated between memory cells. In general, in a conventional arrangement a memory cell relatively adjacent to the substrate may be first programmed In the case where a diameter of a channel hole decreases with increasing depth of the channel hole (i.e., the channel hole gets smaller as the channel gets closer to the substrate), in some programming operations or schemes there may be first programmed a memory cell where the diameter of the channel hole is relatively small (or for which a program speed is relatively fast). However, when a memory cell where the diameter of the channel hole is relatively great (or for which a program speed is relatively slow) is programmed immediately after a memory cell where the diameter of the channel hole is relatively smaller, then the just-previously programmed memory cell may experience relatively great program disturbance.

According to an embodiment of the inventive concept, there may be first programmed a memory cell, the program speed of which is relatively slow (or in which a diameter of a channel hole is relatively great). Accordingly, the program disturbance of unselected memory cells may be reduced through a program method according to an embodiment of the inventive concept. The reason for this is that the amount of charges accumulated between memory cells decreases as a diameter of a channel hole decreases.

The address decoder 120 may select one of memory blocks of the memory cell array 110 under control of the control logic 140 in response to an address ADDR. The address decoder 120 may select one of the word lines of the selected memory block. The address decoder 120 may transfer a word line voltage from the voltage generator 150 to the selected word line of the selected memory block. During a program operation, the address decoder 120 may transfer a program/verification voltage to a selected word line and a pass voltage to an unselected word line(s).

In a selected memory block, the address decoder 120 may control a word line voltage such that there is first programmed a memory cell where the channel hole formed perpendicular to the substrate has a relatively great diameter. If memory cells included in the memory cell array 110 are multi-bit memory cells, the address decoder 120 may apply an address scramble scheme in consideration of the program disturbance. However, even in this case, the address decoder 120 may select word lines to satisfy the above-described program order with respect to the same page unit (e.g., an MSB page or an LSB page).

The address decoder 120 may include a channel initializer 121. For example, to satisfy the above-described program order, a program operation may start at any of memory cells of a cell string (or regardless of a location of a memory cell). In general, a channel may be initialized through a string selection line and a bit line that are connected to a cell string. However, in the case where a memory cell adjacent to a string selection line is first programmed, it may be impossible to initialize a channel through the string selection line and the bit line. Accordingly, the channel initializer 121 may perform various channel initialization operations based on the above-described program order. For example, the channel initializer 121 may decide a point in time when voltages are applied to a string selection line, a ground selection line, and a common source line to perform a channel initialization operation corresponding to a program order of memory cells.

The page buffer circuit 130 may operate as a write driver or a sense amplifier depending on a mode of operation. During the program operation, the page buffer circuit 130 may provide a bit line voltage corresponding to data to be programmed to a bit line of the memory cell array 110. During a read operation, the page buffer circuit 130 may sense data stored in a selected memory cell through a bit line. The page buffer circuit 130 may latch and output the sensed data. The page buffer circuit 130 may include a plurality of page buffers that are respectively connected to bit lines.

The control logic 140 may control the address decoder 120, the page buffer circuit 130, and the voltage generator 150 in response to a command CMD and an address ADDR which are provided to non-volatile memory device 100 from an external device (e.g., a controller). During the program operation, the control logic 140 may control the address decoder 120, the page buffer circuit 130, and the voltage generator 150 such that memory cells arranged in a vertical structure are programmed in an order that is determined according to the size of a channel hole for the memory cells. In particular, memory cells, the channel holes of which are relatively large, from among the memory cells of a selected memory block may be first programmed under control of the control logic 140, and memory cells of the selected memory block whose channel holes are relatively small may be programmed under control of the control logic 140 after the memory cells whose channel holes are relatively large.

For example, the control logic 140 may include an address scramble selector 141. The address scramble selector 141 may store information about a channel hole profile associated with cell strings included in the memory cell array 110. The channel hole profile may be defined in a process step. If the channel hole profile is defined in the process step, the address scramble selector 141 may store the channel hole profile information. The address scramble selector 141 may select a word line corresponding to a received address ADDR based on the channel hole profile information. That is, the address scramble selector 141 may select one of address scrambles based on the channel hole profile information. The term "address scramble" may refer to a way to map memory cells included in one cell string and word lines.

Under control of the control logic 140, the voltage generator 150 may generate various kinds of word line voltages to be supplied to the word lines and a voltage to be supplied to a bulk (e.g., a well area) in which the memory cells are formed. The word line voltages to be supplied to the word lines may include a program voltage (e.g., VPGM), a pass voltage (e.g., VPASS), selection and non-selection read voltages (e.g., VRD and VREAD), etc. The voltage generator 150 may generate selection line voltages (e.g., VSSL and VGSL) to be provided to the selection lines SSL and GSL during the read operation and the program operation.

The non-volatile memory device 100 according to an embodiment of the inventive concept may determine a program order of memory cells with reference to the size of a channel hole. Accordingly, the program disturbance that occurs at unselected memory cells among memory cells formed in a vertical structure (e.g., a cell string structure) may be reduced or minimized.

Figure 2:
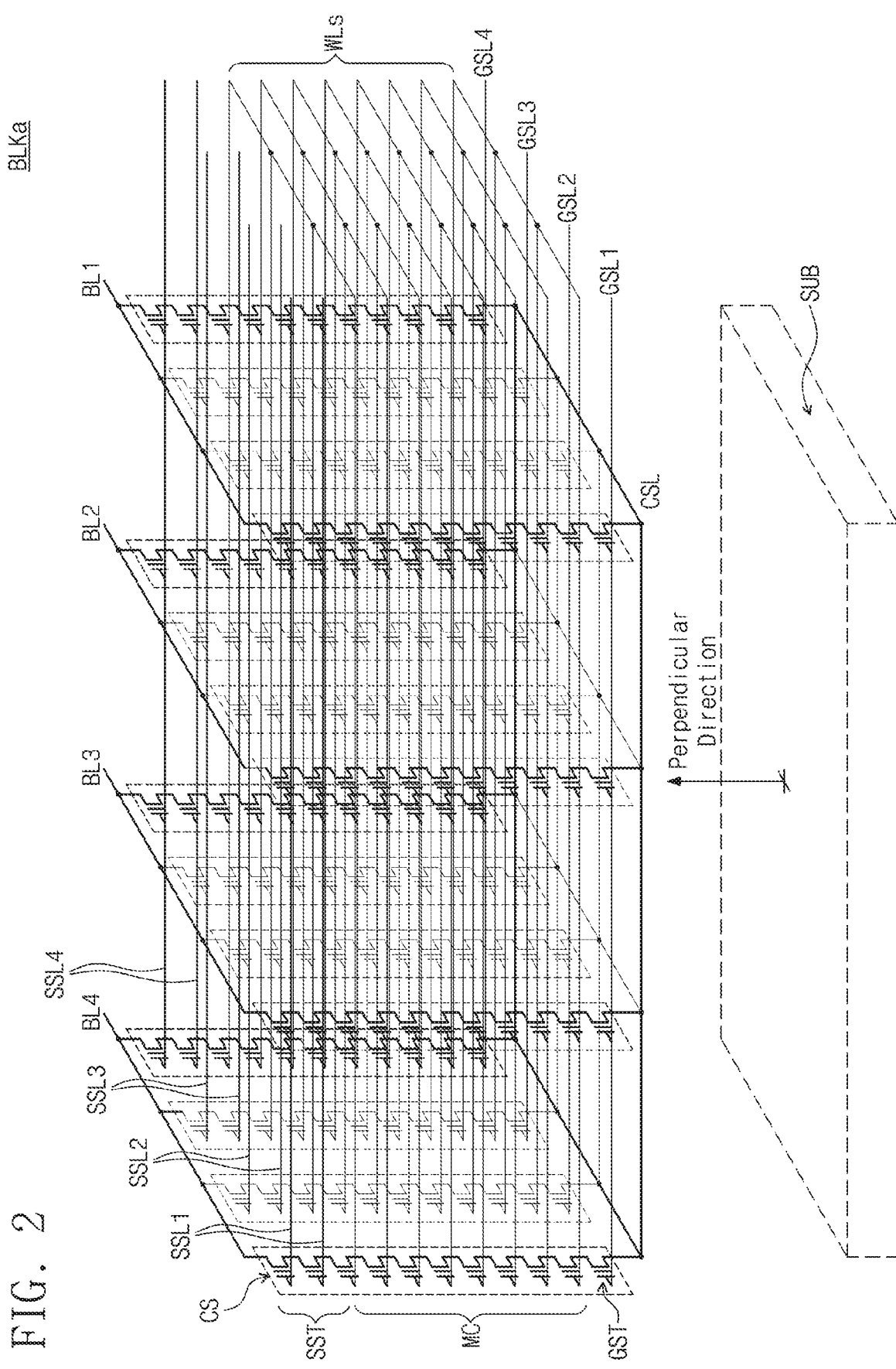
FIG. 2 is a view illustrating a memory block according to an embodiment of the inventive concept.

FIG. 2 is a view illustrating a memory block BLKa according to an embodiment of the inventive concept. Referring to FIG. 2, a plurality of cell strings CS may be arranged on a substrate SUB (e.g., a silicon substrate) in rows and columns. The cell strings CS may be connected in common to a common source line CSL that is formed on (or in) the substrate SUB. In FIG. 2, a location of the substrate SUB is exemplified to help understand a structure of the memory block BLKa. An embodiment is exemplified in FIG. 2 as the common source line CSL is connected to lower ends of the cell strings CS. However, it is sufficient that the common source line CSL is electrically connected to the lower ends of the cell strings CS (i.e., the ends nearest to the substrate SUB). However, embodiments of the inventive concept may not be limited to the case that the common source line CSL is physically located at the lower ends of the cell strings CS (i.e., the ends nearest to the substrate SUB). In an embodiment, the cell strings CS are shown in FIG. 2 as being arranged in 4 by 4 groups. However, embodiments of the inventive concept may not be limited thereto.

Cell strings CS of each row may be connected to the corresponding one of first to fourth ground selection lines GSL1 to GSL4 and the corresponding one of first to fourth string selection lines SSL1 to SSL4. However, the first to fourth ground selection lines GSL1 to GSL4 may be connected in common to each other. Cell strings CS of each column may be connected to the corresponding one of first to fourth bit lines BL1 to BL4. For ease of illustration, cell strings CS that are connected to the second and third ground selection lines GSL2 and GSL3 or the second and third string selection lines SSL2 and SSL3 are depicted to be blurry.

Each cell string CS may include at least one ground selection transistor GST connected to the corresponding ground selection line, a plurality of memory cells MC respectively connected to a plurality of word lines WLs, and at least one (or two) string selection transistors SST connected to the corresponding string selection line. In each cell string CS, the ground selection transistor GST, the memory cells MC, and the string selection transistor SST may be serially connected to each other in a direction that is perpendicular to the substrate SUB and may be sequentially stacked in the direction that is perpendicular to the substrate SUB. Also, the memory cells MC In each cell string CS may include a dummy memory cell that is not used to store data. The dummy memory cell may be used for various purposes.

Memory cells of the cell strings CS that are arranged at the same height from the substrate SUB or the ground selection transistor GST may be connected to the same word line. Memory cells of the cell strings CS that are arranged at different heights from the substrate SUB or the ground selection transistor GST may be connected to different word lines.

The memory block BLKa may be implemented with a three-dimensional (3D) memory array. The 3D memory array may be monolithically formed in one or more physical levels of arrays of memory cells MC having an active area disposed above a substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the inventive concept, the 3D memory array includes vertical NAND strings (or cell strings) that are vertically oriented such that at least one memory cell is located over another memory cell. The at least one memory cell may comprise a charge trap layer. Each vertical NAND string may further include at least one selection transistor disposed above the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3A:
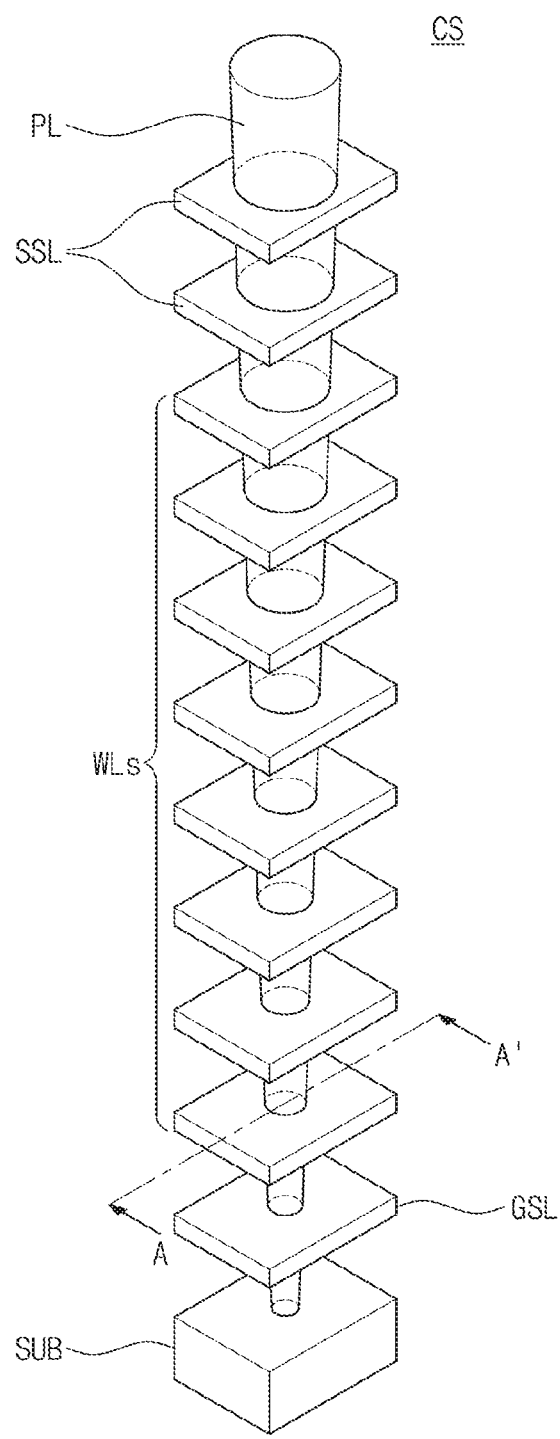
FIG. 3A is a view illustrating a structure of a cell string in the memory block of FIG. 2.
Figure 3B:
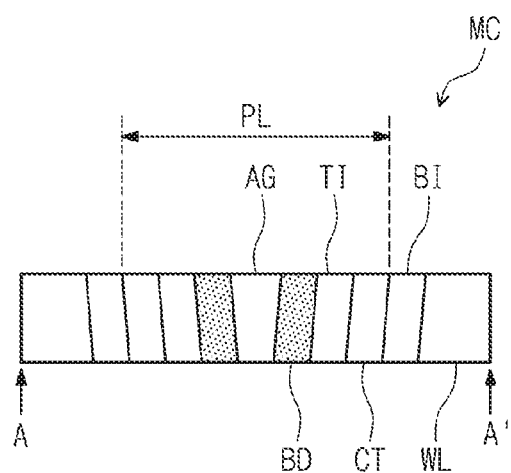
FIG. 3B is a view illustrating a structure of one memory cell of FIG. 3A.

FIG. 3A is a view illustrating a structure of a cell string CS in the memory block BLKa of FIG. 2. FIG. 3B is a view illustrating a structure of one memory cell MC of the cell string CS FIG. 3A. Referring to FIGS. 2, 3A, and 3B, a pillar PL that extends in a direction perpendicular to the substrate SUB and makes contact with the substrate SUB is provided on the substrate SUB. Each of a ground selection line GSL, word lines WLs, and string selection lines SSL may be formed of a conductive material (e.g., a metal material) in parallel with the substrate SUB. The pillar PL may make contact with the substrate SUB through the conductive materials that form the string selection lines SSL, the word lines WLs, and the ground selection line GSL. Also, the word lines WLs may include a dummy word line connected to a dummy memory cell that is not used to store data. The dummy word line may be used for various purposes.

FIG. 3B shows a sectional view of a memory cell MC of the cell string CS of FIG. 3A taken along a line A-A', corresponding to one word line WL. The pillar PL may include a cylindrical body BD. An air gap AG may be defined in the interior of the body BD. The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between a word line WL and the pillar PL. The body BD, the tunnel insulating layer TI, the charge trap layer CT, the blocking insulating layer BI, and one word line may constitute a charge trap type transistor that is formed in a direction perpendicular to the substrate SUB or to an upper surface of the substrate SUB. A string selection transistor SST, a ground selection transistor GST, and other memory cells may have the same structure as the memory cell MC shown in FIG. 3B.

In the process of manufacturing the cell string CS, the shorter the distance is from the substrate SUB, the smaller is the width of the pillar PL or a cross-sectional area parallel with the upper surface of the substrate SUB. Accordingly, when the same voltage is applied to bodies of the ground selection transistor GST, the memory cells MCs, and the string selection transistors SST, and the same voltage is applied to the ground selection line GSL, the word lines WLs, and the string selection lines SSL, then an electric field formed at a memory cell MC or the ground selection transistor GST that is adjacent to the substrate SUB may be greater than an electric field formed at a memory cell MC or the string selection transistor SST that is distant from the substrate SUB. The above-described characteristic may have an influence on the program disturbance that occurs while a program operation is performed. However, the width of the pillar PL or the cross-sectional area parallel with the upper surface of the substrate SUB may not be limited thereto. The width of the pillar PL or the cross-sectional area parallel with the upper surface of the substrate SUB may be differently formed corresponding to the distance from the substrate SUB, depending on an etching process.

FIGS. 4A to 4F are views illustrating various examples of channel holes of a cell string. A channel hole of a cell string may be formed in various shapes depending on an etching process. In FIGS. 4A to 4F, one cell string may include first to n-th memory cells MC1 to MCn, where n is a natural number. For example, the first memory cell MC1 may be the memory cell which is closest to the substrate SUB, and the n-th memory cell MCn may be the memory cell which is most distant from the substrate SUB.

Figure 4A:
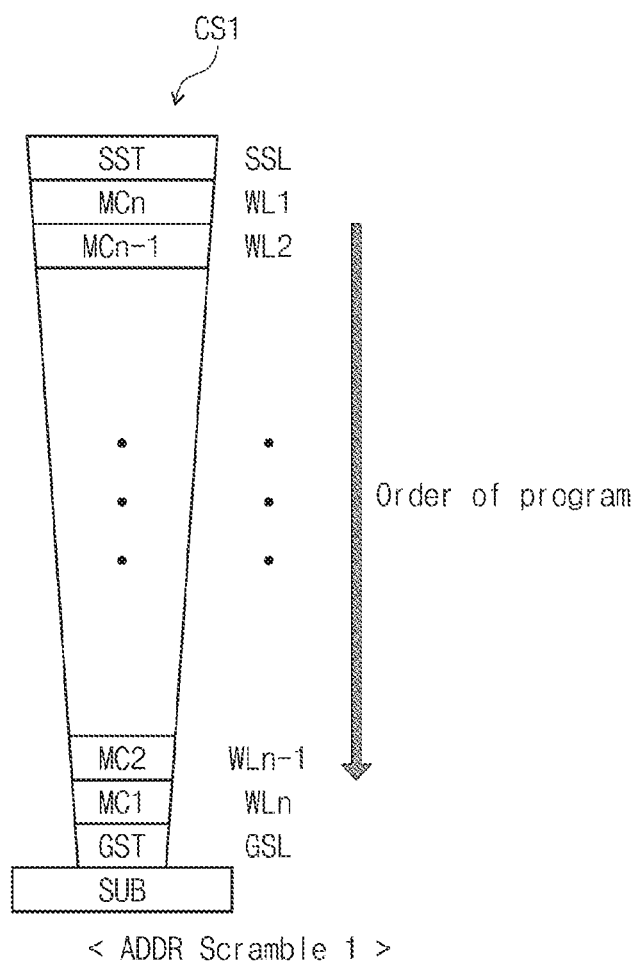
FIG. 4A, FIG. 4B, FIG. 4C, FIG. 4D, FIG. 4E and FIG. 4F are views illustrating example embodiments of pillars (or channel holes) associated with one string.

Referring to FIG. 4A, in a first cell string CS1, the size of a memory cell may increase as a distance from the substrate SUB increases. According to an embodiment of the inventive concept, there may be first programmed a memory cell, the program speed of which is relatively slow (or in which a diameter of a channel hole is relatively great). For example, the non-volatile memory device 100 which includes the cell string CS1 may map the n-th memory cell MCn onto a first word line WL1. The non-volatile memory device 100 may map the (n−1)-th memory cell MCn−1 onto a second word line WL2. The non-volatile memory device 100 may map the second memory cell MC2 onto an (n−1)-th word line WLn−1. The non-volatile memory device 100 may map the first memory cell MC1 onto an n-th word line WLn. The non-volatile memory device 100 may sequentially map memory cells between the first and n-th memory cells MC1 and MCn onto word lines in the same manner as described above. The non-volatile memory device 100 may sequentially perform a program operation from the first word line WL1 to the n-th word line WLn in response to an input command CMD and an input address ADDR. For example, the program operation may include initializing a channel of a memory cell of the pillar structure of cell string CS1 through the ground selection transistor GST of the pillar structure, and then applying a program voltage to the memory cell of the pillar structure of the cell string. Below, the mapping between memory cells and word lines that is described with reference to FIG. 4A is referred to as a "first address scramble scheme ADDR Scramble 1."

Figure 4B:
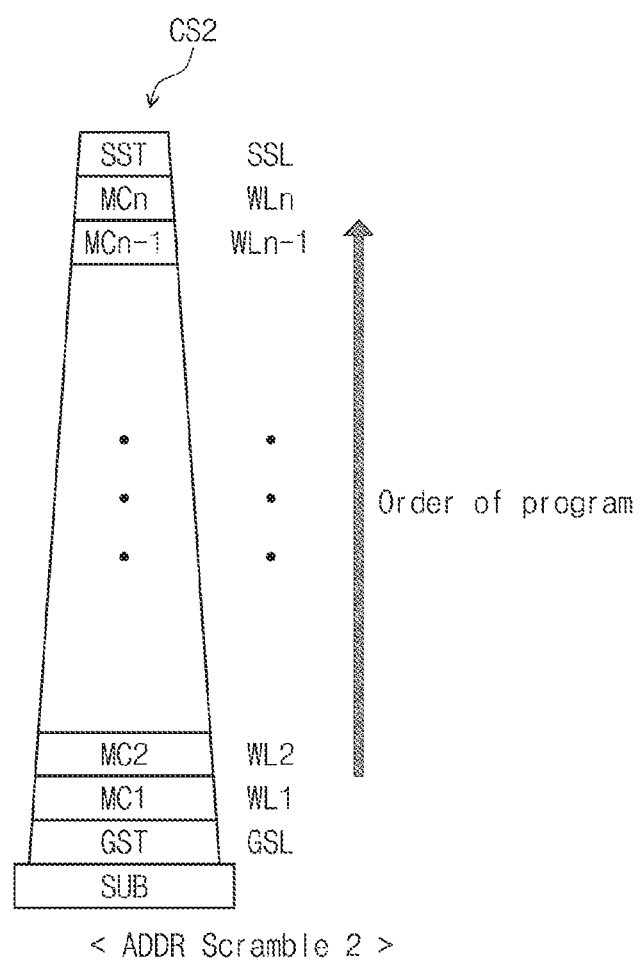

Referring to FIG. 4B, in a second cell string CS2, the size of a memory cell may decrease as a distance from the substrate SUB increases. According to an embodiment of the inventive concept, there may be first programmed a memory cell, the program speed of which is relatively slow (or in which a diameter of a channel hole is relatively great). For example, the non-volatile memory device 100 which includes the cell string CS2 may map the first memory cell MC1 onto the first word line WL1. The non-volatile memory device 100 may map the second memory cell MC2 onto the second word line WL2. The non-volatile memory device 100 may map the (n−1)-th memory cell MCn−1 onto the (n−1)-th word line WLn−1. The non-volatile memory device 100 may map the n-th memory cell MCn onto the n-th word line WLn. The non-volatile memory device 100 may sequentially map memory cells between the first and n-th memory cells MC1 and MCn onto word lines in the same manner as described above. The non-volatile memory device 100 may sequentially perform a program operation from the first word line WL1 to the n-th word line WLn in response to an input command CMD and an input address ADDR. For example, the program operation may include initializing a channel of a memory cell of the pillar structure of cell string CS2 through the string selection transistor SST of the pillar structure, and then applying a program voltage to the memory cell of the pillar structure of the cell string. Below, the mapping between memory cells and word lines that is described with reference to FIG. 4B is referred to as a "second address scramble scheme ADDR Scramble 2."

Figure 4C:
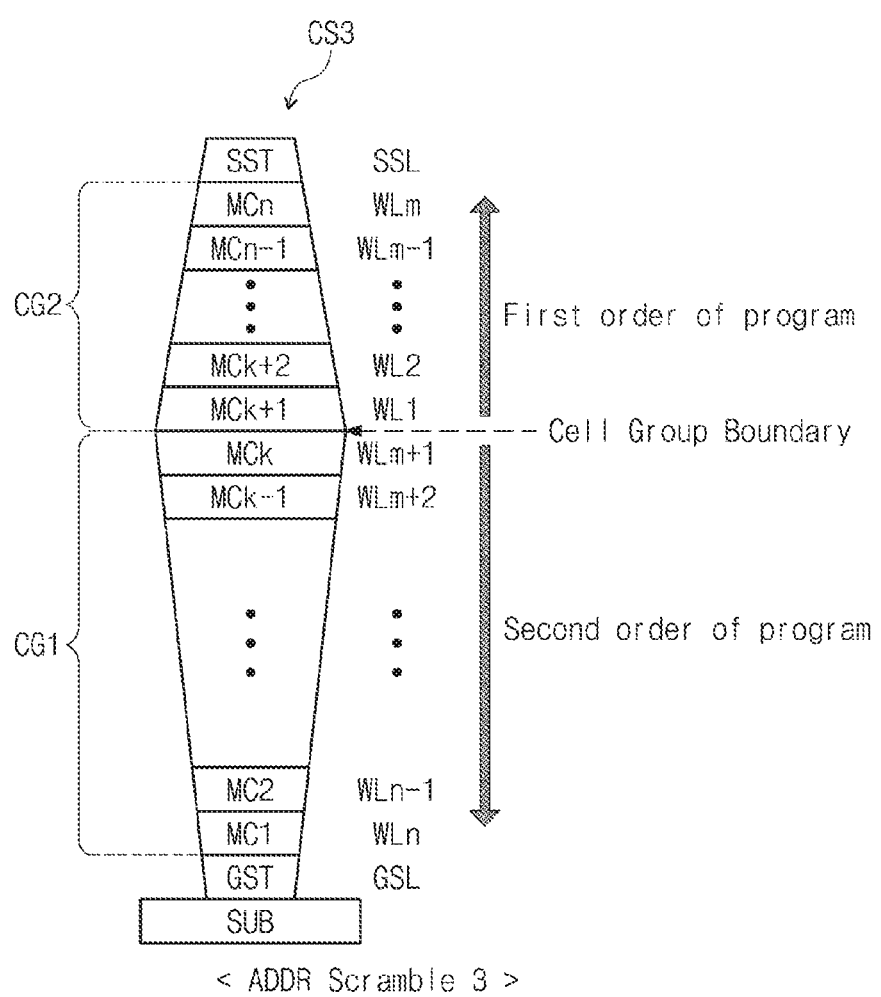

Referring to FIG. 4C, in a third cell string CS3, the size of a memory cell may increase and then decrease as a distance from the substrate SUB increases. According to an embodiment of the inventive concept, there may be first programmed a memory cell, the program speed of which is relatively slow (or in which a diameter of a channel hole is relatively great). However, in the case of FIG. 4C, a diameter of a channel hole may decrease in two opposite directions. For example, a first cell group CG1 includes the first memory cell MC1 to the k-th memory cell MCk; in the first cell group CG1, a diameter of a channel hole increases as a distance from the substrate SUB increases. A second cell group CG2 includes the (k+1)-th memory cell MCk+1 to the n-th memory cell MCn; in the second cell group CG2, a diameter of a channel hole decreases as a distance from the substrate SUB increases. In FIG. 4C, the non-volatile memory device 100 which includes the cell string CS3 may first program memory cells of the second cell group CG2. For example, the non-volatile memory device 100 may map the (k+1)-th memory cell MCk+1 onto the first word line WL1. The non-volatile memory device 100 may map the (k+2)-th memory cell MCk+2 onto the second word line WL2. The non-volatile memory device 100 may map the (n−1)-th memory cell MCn−1 onto the (m−1)-th word line WLm−1. The non-volatile memory device 100 may map the n-th memory cell MCn onto the m-th word line WLm. The non-volatile memory device 100 may sequentially map memory cells between the (k+1)-th and n-th memory cells MCk+1 and MCn onto word lines in the same manner as described above.

Also, the non-volatile memory device 100 which includes the cell string CS3 may map the k-th memory cell MCk onto the (m+1)-th word line WLm+1. The non-volatile memory device 100 may map the (k−1)-th memory cell MCk−1 onto a (m+2)-th word line WLm+2. The non-volatile memory device 100 may map the second memory cell MC2 onto the (n−1)-th word line WLn−1. The non-volatile memory device 100 may map the first memory cell MC1 onto the n-th word line WLn. The non-volatile memory device 100 may sequentially map memory cells between the first and k-th memory cells MC1 and MCk onto word lines in the same manner as described above. Here, "k" may be a natural number less than "n", "m" may be a natural number less than "k", and "k" may be (n−m).

The non-volatile memory device 100 which includes the cell string CS3 may sequentially perform a program operation in two opposite directions (first and second program orders) from the first word line WL1 to the n-th word line WLn in response to an input command CMD and an input address ADDR. That is, the memory cells MC1 to MCn may be discontinuously programmed at a cell group boundary. For example, the program operation for memory cells MCk+1 to MCn may include initializing a channel of a memory cell of the pillar structure of cell string CS3 through the string selection transistor SST of the pillar structure, and then applying a program voltage to the memory cell of the pillar structure of the cell string. And the program operation for memory cells MCk to MC1 may include initializing a channel of a memory cell of the pillar structure of cell string CS3 through the ground selection transistor GST of the pillar structure, and then applying a program voltage to the memory cell of the pillar structure of the cell string. Below, the mapping between memory cells and word lines that is described with reference to FIG. 4C is referred to as a "third address scramble scheme ADDR Scramble 3."

Figure 4D:
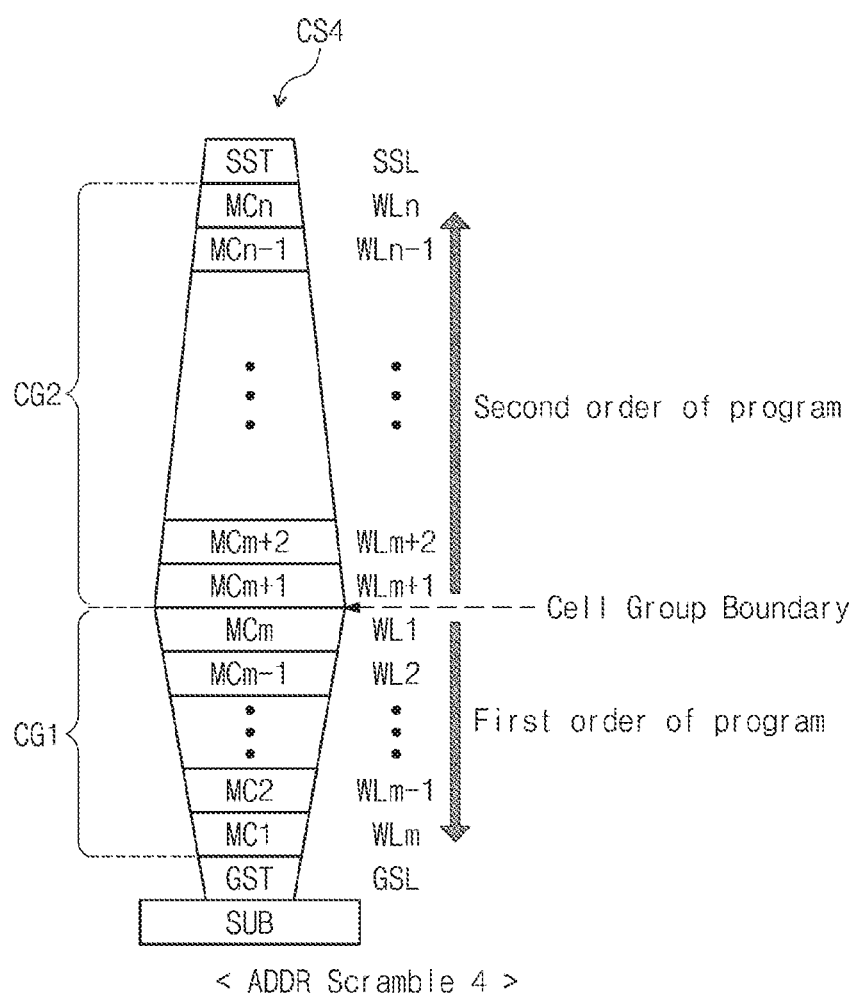

Referring to FIG. 4D, in a fourth cell string CS4, the size of a memory cell may increase and then decrease as a distance from the substrate SUB increases, similar to third cell string CS3. According to an embodiment of the inventive concept, there may be first programmed a memory cell, the program speed of which is relatively slow (or in which a diameter of a channel hole is relatively great). In the case of FIG. 4D, a diameter of a channel hole may decrease in two opposite directions. For example, the first cell group CG1 includes the first memory cell MC1 to the m-th memory cell MCm; in the first cell group CG1, a diameter of a channel hole increases as a distance from the substrate SUB increases. The second cell group CG2 includes the (m+1)-th memory cell MCm+1 to the n-th memory cell MCn; in the second cell group CG2, a diameter of a channel hole decreases as a distance from the substrate SUB increases. The non-volatile memory device 100 which includes the cell string CS4 may first program memory cells of the first cell group CG1. For example, the non-volatile memory device 100 may map the m-th memory cell MCm onto the first word line WL1. The non-volatile memory device 100 may map the (m−1)-th memory cell MCm−1 onto the second word line WL2. The non-volatile memory device 100 may map the second memory cell MC2 onto the (m−1)-th word line WLm−1. The non-volatile memory device 100 may map the first memory cell MC1 onto the m-th word line WLm. The non-volatile memory device 100 may sequentially map memory cells between the m-th and first memory cells MCm and MC1 onto word lines in the same order (e.g., the first program order) as described above.

Also, the non-volatile memory device 100 which includes the cell string CS4 may map the (m+1)-th memory cell MCm+1 onto the (m+1)-th word line WLm+1. The non-volatile memory device 100 may map the (m+2)-th memory cell MCm+2 onto the (m+2)-th word line WLm+2. The non-volatile memory device 100 may map the (n−1)-th memory cell MCn−1 onto the (n−1)-th word line WLn−1. The non-volatile memory device 100 may map the n-th memory cell MCn onto the n-th word line WLn. The non-volatile memory device 100 may sequentially map memory cells between the (m+1)-th and n-th memory cells MCm+1 and MCn onto word lines in the same manner (e.g., the second program order) as described above. Here, "m" may be a natural number less than "n."

The non-volatile memory device 100 which includes the cell string CS4 may sequentially perform a program operation in two opposite directions (first and second program orders) from the first word line WL1 to the n-th word line WLn in response to an input command CMD and an input address ADDR. That is, the memory cells MC1 to MCn may be discontinuously programmed at a cell group boundary. For example, the program operation for memory cells MCm to MC1 may include initializing a channel of a memory cell of the pillar structure of cell string CS4 through the ground selection transistor GST of the pillar structure, and then applying a program voltage to the memory cell of the pillar structure of the cell string. And the program operation for memory cells MCm+1 to MCn may include initializing a channel of a memory cell of the pillar structure of cell string CS4 through the string selection transistor SST of the pillar structure, and then applying a program voltage to the memory cell of the pillar structure of the cell string. Below, the mapping between memory cells and word lines that is described with reference to FIG. 4D is referred to as a "fourth address scramble scheme ADDR Scramble 4."

As one embodiment, in FIGS. 4C and 4D, the non-volatile memory device 100 may first program a cell group in which the number of memory cells is relatively small. This may be only one embodiment, and a program order of cell groups may not be limited thereto.

Figure 4E:
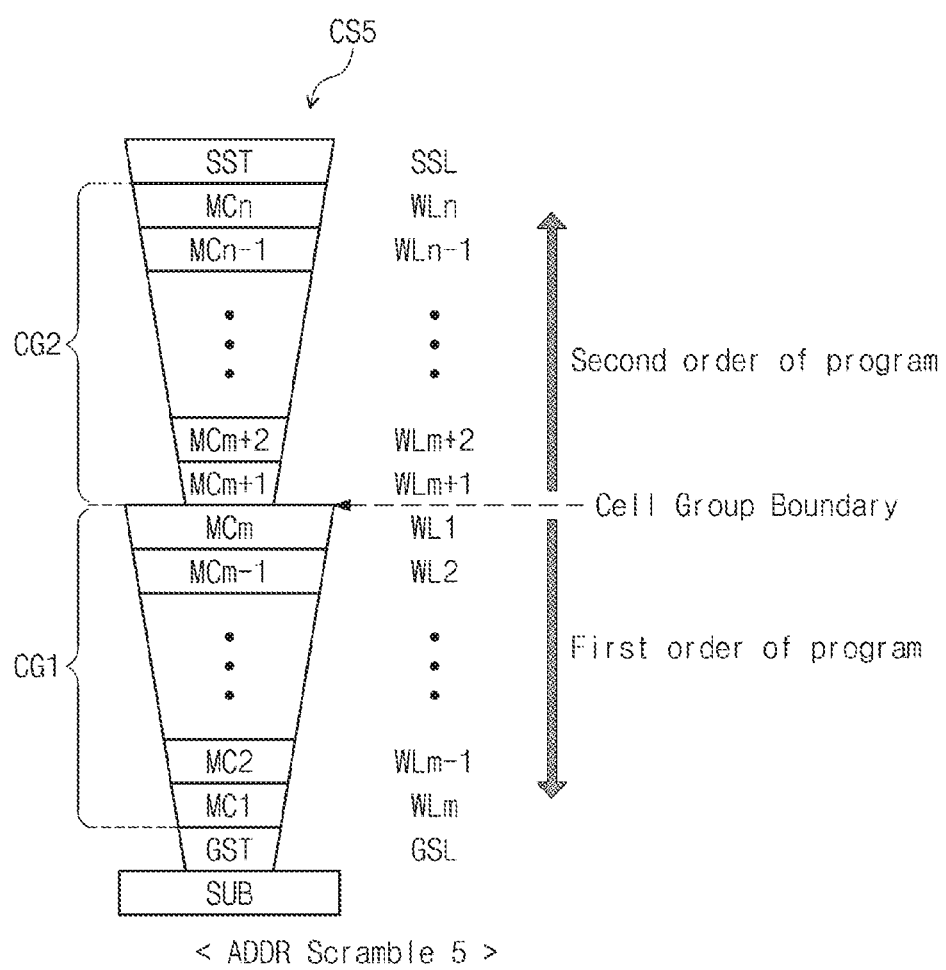

Referring to FIG. 4E, a fifth cell string CS5 may include two cell groups CG1 and CG2 in each of which the size of a memory cell increases as a distance from the substrate SUB increases. The first cell group CG1 may include the first memory cell MC1 to the m-th memory cell MCm, the sizes of which increase in order from MC1 to MCm (as the distance from the substrate increases). The second cell group CG2 may include the (m+1)-th memory cell MCm+1 to the n-th memory cell MCn, the sizes of which increase in order from MCm+1 to MCn (as the distance from the substrate increases). The non-volatile memory device 100 which includes the cell string CS5 may program the first and second cell groups CG1 and CG2 in different address scramble schemes. For example, in the first cell group CG1, there may be first programmed a memory cell, the program speed of which is relatively slow (or in which a diameter of a channel hole is relatively great) and then a memory cell, the program speed of which is relatively fast (or in which a diameter of a channel hole is relatively small) may be programmed next. In the second cell group CG2, there may be first programmed a memory cell, the program speed of which is relatively fast (or in which a diameter of a channel hole is relatively small) and then a memory cell, the program speed of which is relatively slow (or in which a diameter of a channel hole is relatively great) may be programmed next.

For example, the first and second cell groups CG1 and CG2 may correspond to different sub blocks. In this case, if the first cell group CG1 is first programmed, it may be impossible to initialize a channel in a program operation of the second cell group CG2 through the ground selection transistor GST. Accordingly, in this case, a channel may be initialized through a string selection transistor SST by using a normal address scramble scheme in a program operation of the second cell group CG2.

The non-volatile memory device 100 may sequentially perform a program operation in two opposite directions (the first and second program orders) from the first word line WL1 to the n-th word line WLn in response to an input command CMD and an input address ADDR. That is, the memory cells MC1 to MCn may be discontinuously programmed at a cell group boundary. Below, the mapping between memory cells and word lines that is described with reference to FIG. 4E is referred to as a "fifth address scramble scheme ADDR Scramble 5."

Figure 4F:
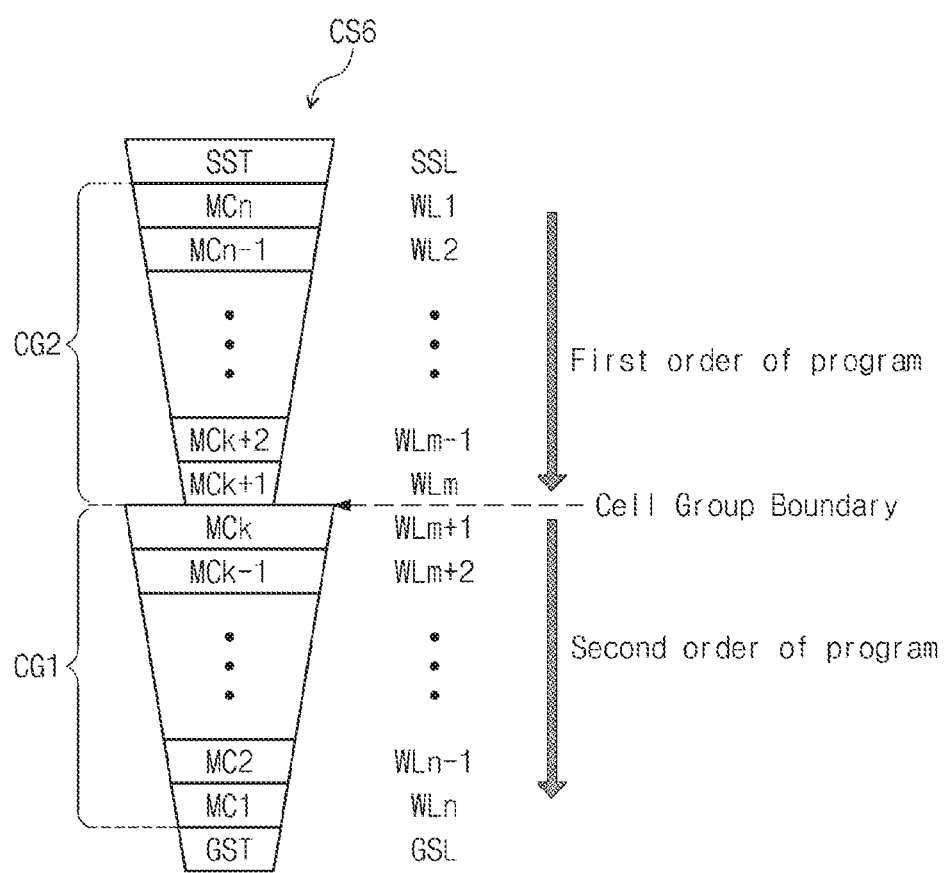

Referring to FIG. 4F, a sixth cell string CS6 may include two cell groups CG1 and CG2 in each of which the size of a memory cell increases as a distance from the substrate SUB increases. The first cell group CG1 may include the first memory cell MC1 to the k-th memory cell MCk, the sizes of which increase in order. The second cell group CG2 may include the (k+1)-th memory cell MCk+1 to the n-th memory cell MCn, the sizes of which increase in order. The non-volatile memory device 100 which includes the cell string CG6 may program the first and second cell groups CG1 and CG2 in the similar manner as the first string CS1 of FIG. 4A. For example, in the first and second cell groups CG1 and CG2, there may be first programmed a memory cell, the program speed of which is relatively slow (or in which a diameter of a channel hole is relatively great). However, only at the cell group boundary, there may be first programmed a memory cell, the program speed of which is relatively fast (or in which a diameter of a channel hole is relatively small).

Meanwhile, the first and second cell groups CG1 and CG2 may correspond to different sub blocks. In this case, each of the first and second cell groups CG1 and CG2 may be programmed in the similar manner as the first string CS1 of FIG. 4A. For example, in FIG. 4F, the non-volatile memory device 100 may first program memory cells of the second cell group CG2. The non-volatile memory device 100 may map the n-th memory cell MCn onto the first word line WL1. The non-volatile memory device 100 may map the (n−1)-th memory cell MCn−1 onto the second word line WL2. The non-volatile memory device 100 may map the (k+2)-th memory cell MCk+2 onto the (m−1)-th word line WLm−1. The non-volatile memory device 100 may map the (k+1)-th memory cell MCk+1 onto the m-th word line WLm. The non-volatile memory device 100 may sequentially map memory cells between the n-th and (k+1)-th memory cells MCn and MCk+1 onto word lines in the same order (e.g., the first program order) as described above.

Also, the non-volatile memory device 100 may map the k-th memory cell MCk onto the (m+1)-th word line WLm+1. The non-volatile memory device 100 may map the (k−1)-th memory cell MCk−1 onto the (m+2)-th word line WLm+2. The non-volatile memory device 100 may map the second memory cell MC2 onto the (n−1)-th word line WLn−1. The non-volatile memory device 100 may map the first memory cell MC1 onto the n-th word line WLn. The non-volatile memory device 100 may sequentially map memory cells between the k-th and first memory cells MCk and MC1 onto word lines in the same manner (e.g., the second program order) as described above. Here, "k" may be a natural number less than "n", "m" may be a natural number less than "n", and "n" may be (k+m).

In FIG. 4F, the non-volatile memory device 100 which includes the cell string CG6 may sequentially perform a program operation from the first word line WL1 to the n-th word line WLn in response to an input command CMD and an input address ADDR. That is, in contrast to the case illustrated in FIG. 4E, the memory cells MC1 to MCn may be continuously programmed across a cell group boundary. Below, the mapping between memory cells and word lines that is described with reference to FIG. 4F is referred to as a "sixth address scramble scheme ADDR Scramble 6".

As described above, the non-volatile memory device 100 according to an embodiment of the inventive concept may first program a memory cell, the program speed of which is relatively slow (or in which a diameter of a channel hole is relatively great), regardless of a shape of a channel hole of a cell string. As such, during a program operation that is performed with respect to one cell string, the size of a memory cell which was programmed immediately prior to a selected memory cell to be programmed in a current program operation may always be larger than the size of the selected memory cell to be programmed in the current program operation. Accordingly, the non-volatile memory device 100 may reduce the program disturbance between memory cells in the same cell string.

Meanwhile, in the case where one cell string includes a plurality of cell groups in which shapes of channel holes are different from each other, the non-volatile memory device 100 may determine and select an address scramble scheme such that memory cells are discontinuously programmed at a cell group boundary between the cell groups. Below, in the case where one of the first to fifth address scramble schemes is determined and selected, program operations that are applicable to program memory cells depending on the decided address scramble scheme will be described.

Figure 5:
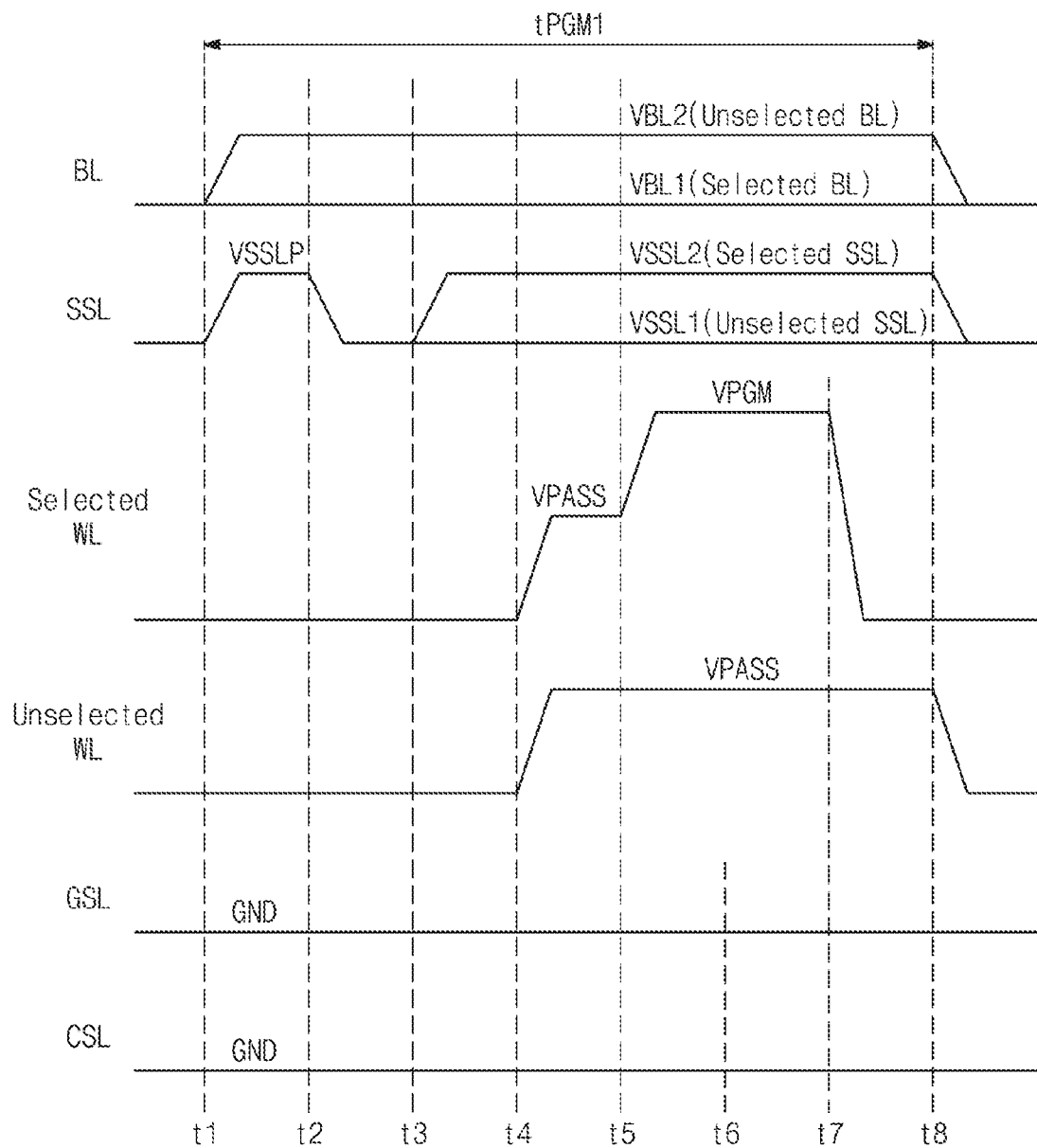
FIG. 5 is a timing diagram illustrating voltages applied to a memory cell array when a normal address scramble scheme is used.

FIG. 5 is a timing diagram illustrating voltages applied to a memory cell array when a normal address scramble scheme is used. Below, a program operation of the non-volatile memory device 100 in the case where a memory cell relatively close to a substrate is first programmed will be described with reference to FIG. 5. For example, in the normal address scramble scheme, a channel may be initialized through a string selection transistor.

At a first time point t1, a second bit line voltage VBL2 may be provided to an unselected bit line. For example, the second bit line voltage VBL2 may be a power supply voltage Vcc. According to the bias condition, memory cells connected to the unselected bit line may be program inhibited. A selected bit line may be maintained at a level of a first bit line voltage VBL1. For example, the first bit line voltage VBL1 may be a ground voltage GND. At the first time point t1, also, a string selection line precharge voltage VSSLP may be applied to all string selection lines of a selected memory block. For example, the string selection line precharge voltage VSSLP may be the power supply voltage Vcc. According to the bias condition, a channel connected to each of the all string selection lines may be initialized. That is, all string selection transistors of the selected memory block may be turned on, and thus, a channel potential of each of all cell strings of the selected memory block may be set to a voltage level corresponding to the first bit line voltage VBL1 or the ground voltage GND. At a second time point t2, the string selection line precharge voltage VSSLP may be cut off after all string selection lines are initialized.

At a third time point t3, also, a second string selection line voltage VSSL2 may be supplied to a selected string selection line. For example, the second string selection line voltage VSSL2 may be the power supply voltage Vcc. An unselected string selection line may be maintained at a level of a first string selection line voltage VSSL1. For example, the first string selection line voltage VSSL1 may be the ground voltage GND. That is, an unselected string selection transistor may be turned off.

At a fourth time point t4, a pass voltage VPASS may be applied to all word lines. Here, the pass voltage VPASS applied to the unselected word line may be maintained until the program operation is completed. In this case, channel voltages of cell strings connected to the unselected string selection line may increase according to self boosting.

At a fifth time point t5, a program voltage VPGM may be applied to a selected word line. In this case, a memory cell connected to the selected word line of a selected cell string is programmed. A cell string connected to the unselected string selection line may maintain a boosting state in a period t5 to t7 while the memory cell is programmed For this reason, in unselected cell strings, memory cells connected to the selected word line may be program inhibited.

At a seventh time point t7, the program voltage VPGM applied to the selected word line may be recovered. At an eighth time point t8, all the applied voltages may be recovered. Below, the program scheme is referred to as a "first program operation." For example, the first program operation may be performed during a first program time tPGM1 (from t1 to t8). In the first program operation, a channel of a selected cell string may be initialized through a string selection transistor.

FIGS. 6 to 9 are timing diagrams illustrating program operations according to embodiments of the inventive concept. In FIGS. 6 to 9, some operations may be the same as or similar to the operations described with reference to FIG. 5, and a description thereof is thus omitted below.

Figure 6:
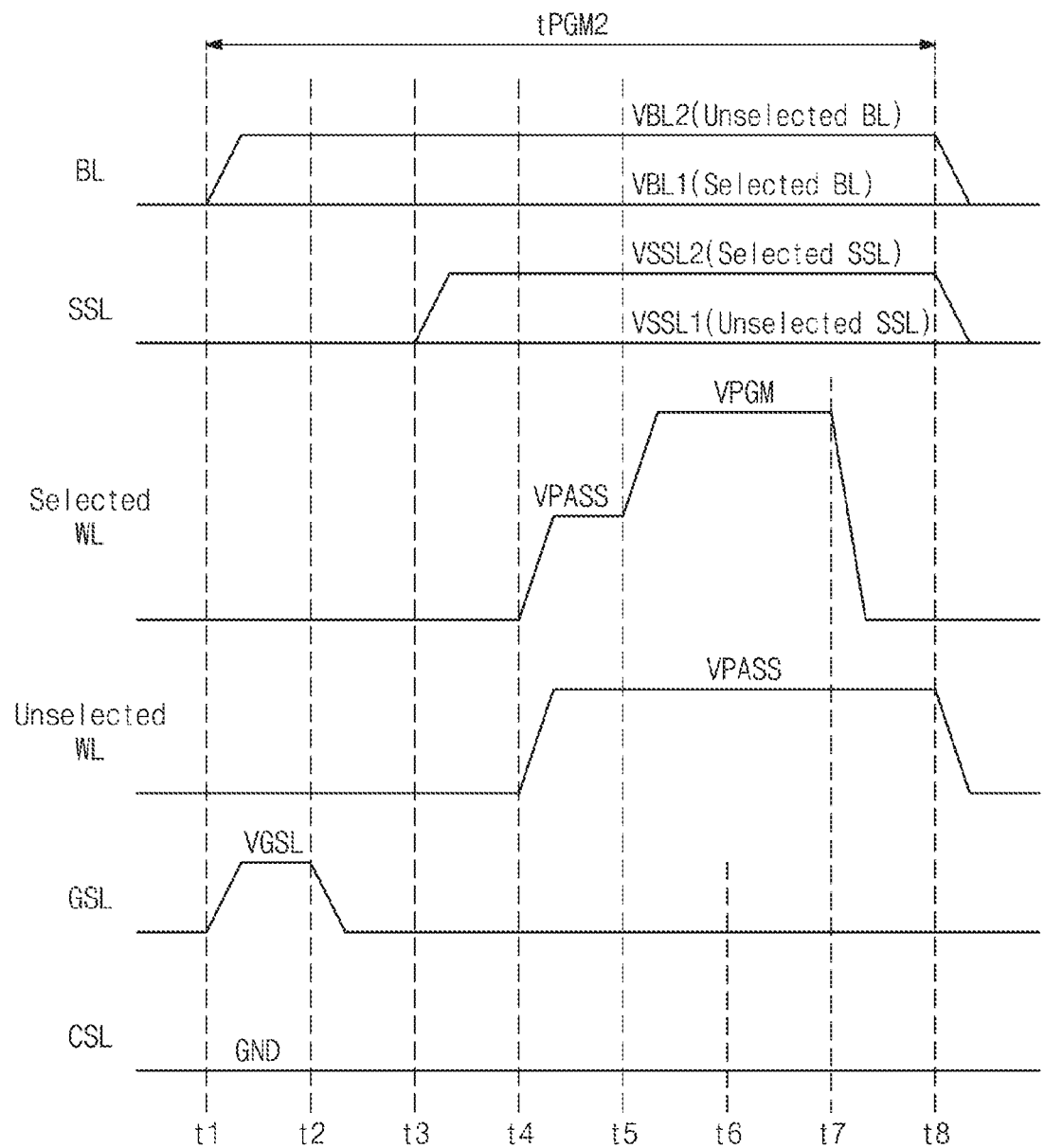

FIG. 6 is a timing diagram of a program operation for performing the first address scramble scheme of FIG. 4A. Below, a program operation of FIG. 6 is referred to as a "second program operation." According to the first address scramble scheme, a memory cell, which is adjacent to a string selection line, from among memory cells included in a cell string is first programmed Accordingly, all memory cells between a selected memory cell and the first memory cell MC1 may remain at an erase state. Also, if at least one of memory cells experiencing a program operation is programmed from an erase state to a program state, it may be impossible to initialize a channel of a cell string through a string selection transistor any more. Accordingly, in the second program operation, a channel of a cell string may be initialized through a ground selection transistor. To this end, in a period t1 to t2, the ground selection line voltage VGSL may be applied to a ground selection line GSL.

At a first time point t1, the second bit line voltage VBL2 may be provided to an unselected bit line. However, string selection lines may be maintained at a level of the first string selection line voltage VSSL1. After the channel of the cell string is completely initialized, at a third time point t3, the second string selection line voltage VSSL2 may be supplied to a selected string selection line. The second program operation may be performed during a second program time tPGM2 (from t1 to t8).

Figure 7:
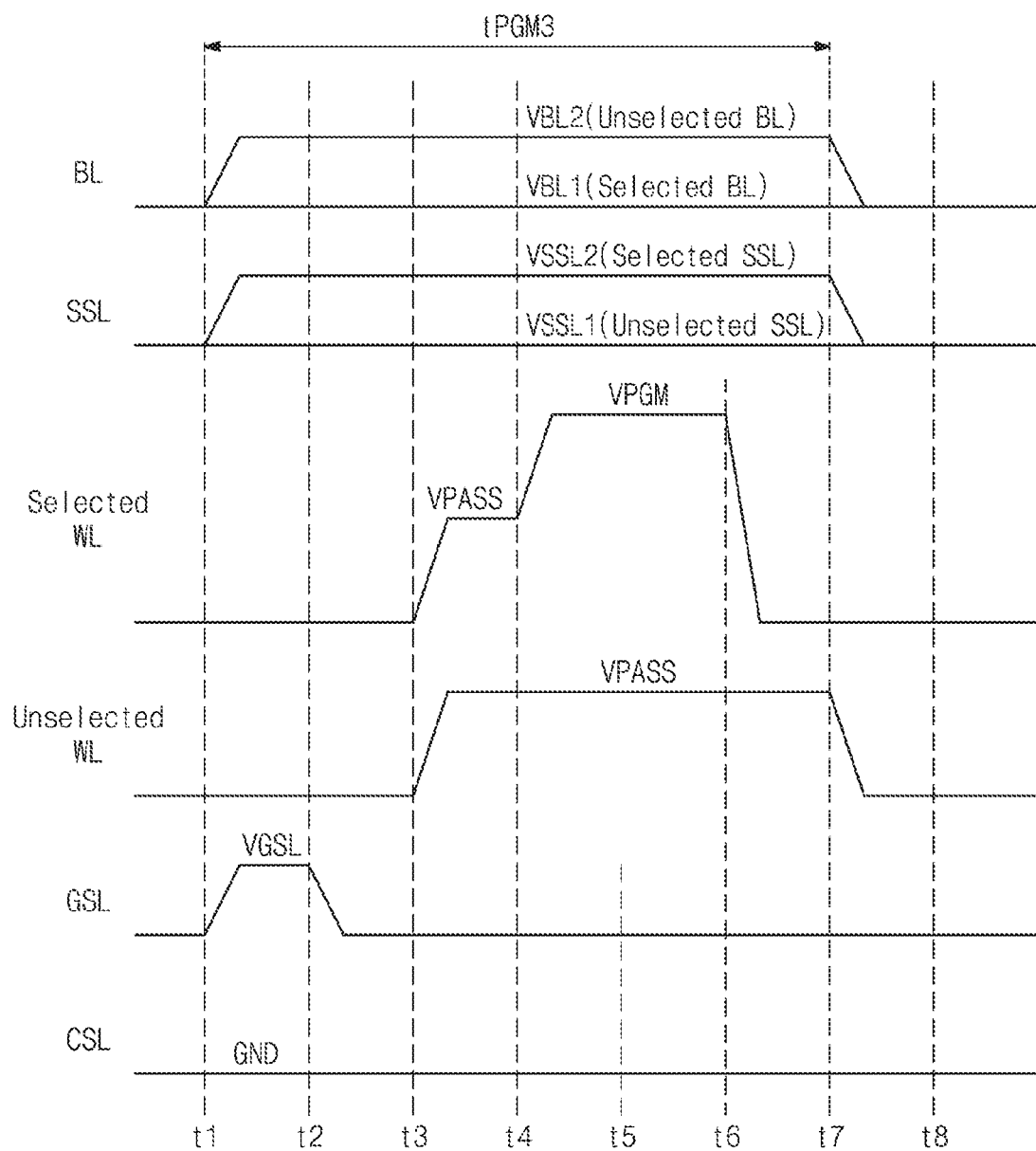

FIG. 7 is a timing diagram illustrating a program operation for reducing a program time in the case where the number of memory cells programmed through the second program operation exceeds a specific value when the first address scramble scheme of FIG. 4A is used. Below, a program operation of FIG. 7 is referred to as a "third program operation."

Referring to FIG. 7, at the first time point t1, the second string selection line voltage VSSL2 also may be supplied to a selected string selection line when the ground selection line voltage VGSL is applied to a ground selection line. The reason for this is that, if at least one memory cell programmed to a program state from an erase state exists between a selected memory cell and a string selection transistor, a channel of a cell string is shut off due to the memory cell which is programmed to the program state. The third program operation may be performed during a third program time tPGM3. In FIG. 6, during the second program operation, the second string selection line voltage VSSL2 may be supplied after the supplying of the ground selection line voltage VGSL is interrupted. That is, the period t3 to t4 of FIG. 6 is unnecessary during the third program operation. Accordingly, the third program time tPGM3 (from t1 to t7), which eliminates this time period, may be shorter than the second program time tPGM2 (from t1 to t8).

Figure 8:
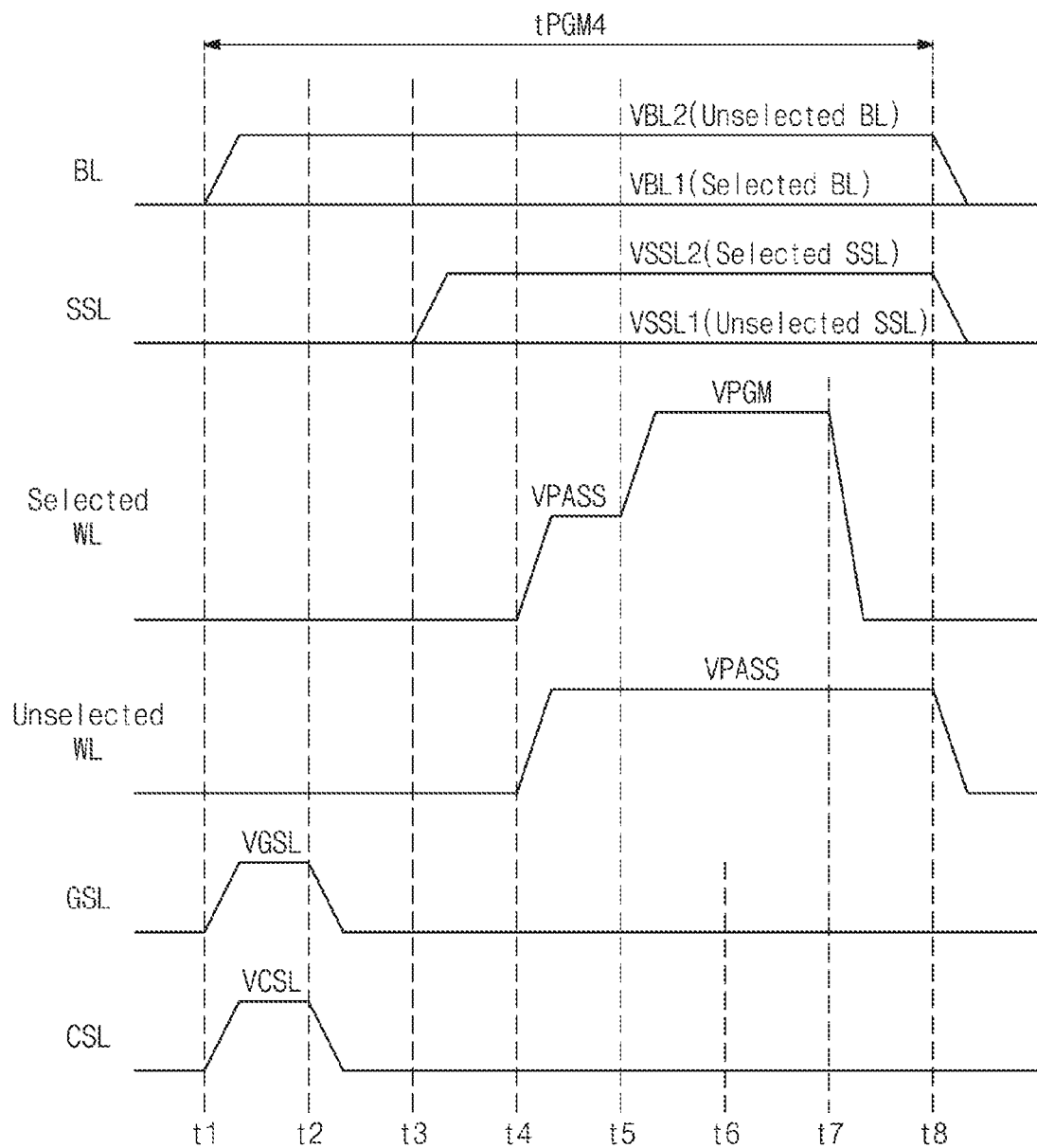

In some embodiments, memory cells may be programmed in an incremental step pulse programming (ISPP) scheme which includes a plurality of program loops, where the program voltage may increase as the number of program loops increases. FIG. 8 is a timing diagram illustrating a method for preventing program disturbance in the case where a program loop of a specific number of times passes when the second program operation of FIG. 6 is performed, for example using the ISPP scheme.

Referring to FIG. 8, the common source line voltage VCSL may be applied to the common source line CSL when a channel is initialized at a first time point t1. In this case, a channel of a cell string may be initialized to a level of the common source line voltage VCSL. Below, a program operation of FIG. 8 is referred to as a "fourth program operation." According to the fourth program operation, a program disturbance due to a difference between the increased program voltage VPGM and a channel voltage may be reduced or prevented. The fourth program operation may be performed during a fourth program time tPGM4 (from t1 to t8).

FIG. 9 is a timing diagram illustrating a program operation for reducing a program time of the fourth program operation of FIG. 8. Below, a program operation of FIG. 9 is referred to as a "fifth program operation." Referring to FIG. 9, in the case where the number of memory cells programmed through the fourth program operation exceeds a specific value, the second string selection line voltage VSSL2 may be supplied to a selected string selection line at a point in time t1 when the ground selection line voltage VGSL and the common source line voltage VCSL are respectively to a ground selection line and a common source line. The reason is that, if at least one memory cell programmed to a program state from an erase state exists between a selected memory cell and a string selection transistor, a channel of a cell string is shut off due to the memory cell of the program state. The fifth program operation may be performed during a fifth program time tPGM5. In FIG. 8, during the fourth program operation, the second string selection line voltage VSSL2 may be supplied to the selected string selection line after the supplying of the ground selection line voltage VGSL is interrupted. That is, the period t3 to t4 of FIG. 8 is unnecessary during the fifth program operation. Accordingly, the fifth program time tPGM5 (from t1 to t7), which eliminates this time period, may be shorter than the fourth program time tPGM4 (from t1 to t8).

FIGS. 10 to 14 are drawings illustrating program operations applied for the respective address scramble schemes according to embodiments of the inventive concept.

FIG. 10 shows an embodiment of program operations applied according to the first to sixth address scramble schemes. Referring to FIG. 10, in the case of using the first address scramble scheme of FIG. 4A and in the case of using the sixth address scramble scheme of FIG. 4F, the non-volatile memory device 100 may program memory cells connected to all word lines through the second program operation. In the case of using the second address scramble scheme of FIG. 4B, the non-volatile memory device 100 may program memory cells connected to all word lines through the first program operation.

In the case of using the third address scramble scheme of FIG. 4C, the non-volatile memory device 100 may program memory cells connected to the first to m-th word lines WL1 to WLm through the first program operation. Also, the non-volatile memory device 100 may program memory cells connected to the (m+1)-th to n-th word lines WLm+1 to WLn through the second program operation.

In the case of using the fourth address scramble scheme of FIG. 4D and the fifth address scramble scheme of FIG. 4E, the non-volatile memory device 100 may program memory cells connected to the first to m-th word lines WL1 to WLm through the second program operation. Also, the non-volatile memory device 100 may program memory cells connected to the (m+1)-th to n-th word lines WLm+1 to WLn through the first program operation.

FIG. 11 shows an embodiment in which memory cells are programmed by using the third program operation after programming is performed with respect to a specific word line, in the case where the second program operation of FIG. 10 is used. The second program operation is used in the first address scramble scheme, and in the third to sixth address scramble schemes. The third program operation is also used in the first address scramble scheme, and in the third to sixth address scramble schemes. A point in time when the third program operation is used may be determined on the basis of a point in time when at least one memory cell is programmed from an erase state to a program state through the second program operation.

FIG. 12 shows program operations applied in the case where the third to fifth address scramble schemes are used. In the case where a channel hole shape of a cell string includes at least two different portions, the third to fifth address scramble schemes may be used. Referring to FIG. 12, a memory cell connected to the first word line WL1 may be programmed through a bit reduction program operation. For example, in the case where a memory cell stores multi-bit data, the memory cell connected to the first word line WL1 may store bits, the number of which is less than that of any other memory cell(s), through the bit reduction program operation. In an embodiment, the bit reduction program operation may mean that 1-bit data are stored in the memory cell connected to the first word line WL1 in the case where 2-bit data are stored in memory cells connected to the second to n-th word lines WL2 to WLn. However, the bit reduction program operation is not limited thereto.

FIG. 13 shows program operations applied according to the number of program loops when the first, third, fourth and sixth address scramble schemes are used. Referring to FIG. 13, first to n-th program loops LOOP1 to LOOPn may progress to program memory cells included in any one cell string.

In the case where a selected cell string is programmed through one of the first, third, fourth and sixth address scramble schemes, memory cells programmed through the second program operation may be programmed through the fourth program operation after a specific program loop. For example, memory cells may be programmed in the ISPP scheme. Accordingly, a program voltage may increase as the number of program loops increases. In this case, the program disturbance may occur due to a difference between the increased program voltage and a channel voltage.

To prevent the program disturbance, the common source line voltage VCSL may be applied to the common source line CSL through the fourth program operation after a specific program loop. In this case, the channel voltage may be set to a voltage corresponding to the common source line voltage VCSL, and a difference between the program voltage and the channel voltage may decrease. A point in time when a program operation is changed (from the second program operation to the fourth program operation) may be determined on the basis of the number of program loops, a level of a program voltage, the number of program-inhibited memory cells, or whether a memory cell, which has a specific program state, from among memory cells is present.

For example, in the case of the first and sixth address scramble schemes, memory cells corresponding to all the word lines WL1 to WLn may be programmed through the second program operation in the first to m-th program loops LOOP1 to LOOPm, and may be programmed through the fourth program operation in the (m+1)-th to n-th program loops LOOPm+1 to LOOPn.

In the case of the third address scramble scheme, the memory cells corresponding to the first to m-th word lines WL1 to WLm may be programmed through the first program operation in all program loops. Meanwhile, memory cells corresponding to the (m+1)-th to n-th word lines WLm+1 to WLn may be programmed through the second program operation in the first to m-th program loops LOOP1 to LOOPm, and may be programmed through the fourth program operation in the (m+1)-th to n-th program loops LOOPm+1 to LOOPn.

In the case of the fourth address scramble scheme, memory cells corresponding to the first to m-th word lines WL1 to WLm may be programmed through the second program operation in the first to m-th program loops LOOP1 to LOOPm, and may be programmed through the fourth program operation in the (m+1)-th to n-th program loops LOOPm+1 to LOOPn. Meanwhile, memory cells corresponding to the (m+1)-th to n-th word lines WLm+1 to WLn may be programmed through the first program operation in all program loops.

FIG. 14 is a view illustrating a combination of the method of FIG. 11 and the method of FIG. 13 when the first, third, fourth and sixth address scramble schemes are used. Referring to FIG. 14, the non-volatile memory device 100 may change a program operation (from the second program operation to the fourth program operation) in a specific program loop LOOPm+1. Also, as described with reference to FIG. 11, the non-volatile memory device 100 may perform not the second program operation but instead the third program operation from a memory cell corresponding to a specific word line. As in the above description, the non-volatile memory device 100 may perform not the fourth program operation but instead the fifth program operation from a memory cell corresponding to a specific word line. Accordingly, the non-volatile memory device 100 may prevent the program disturbance by changing the second program operation into the fourth program operation. Also, the non-volatile memory device 100 may reduce a program time by changing the second program operation into the third program operation or the fourth program operation into the fifth program operation.

Figure 15:
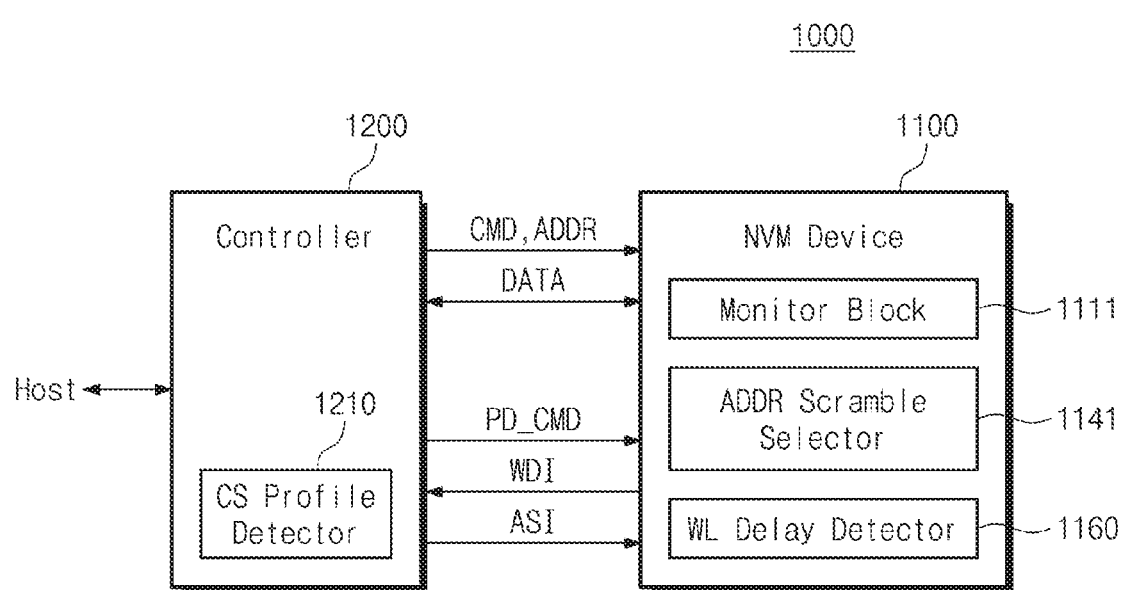
FIG. 15 is a block diagram illustrating a memory system according to an embodiment of the inventive concept.

FIG. 15 is a block diagram illustrating a memory system according to an embodiment of the inventive concept. Referring to FIG. 15, a memory system 1000 may include a non-volatile memory device 1100 and a controller 1200. According to an embodiment of the inventive concept, the memory system 1000 may detect a channel hole profile of cell strings included in the non-volatile memory device 1100 and may determine an address scramble scheme of the non-volatile memory device 1100 based on the detected channel hole profile. For example, the memory system 1000 may select one of the address scramble schemes described with reference to FIGS. 4A to 4F depending on the detected channel hole profile.

The non-volatile memory device 1100 may be the same as, or similar to, the non-volatile memory device of FIG. 1 in configuration and characteristic, except for differences noted below. The controller 1200 may include a cell string profile detector 1210 for detecting a channel hole profile. The cell string profile detector 1210 may issue a profile detection command PD_CMD to the non-volatile memory device 1100. The non-volatile memory device 1100 may output characteristic information of a cell string in response to the profile detection command PD_CMD.

For example, the non-volatile memory device 1100 may include a monitor block 1111 for obtaining characteristic information of a cell string. The non-volatile memory device 1100 may generate word line delay information WDI indicating a resistance characteristic of each word line through the monitor block 1111 and a word line delay detector 1160. The non-volatile memory device 1100 may provide the word line delay information WDI to the controller 1200 in response to the profile detection command PD_CMD. The controller 1200 may generate address scramble selection information ASI based on the word line delay information WDI and may provide the address scramble selection information ASI to the non-volatile memory device 1100. An address scramble selector 1141 included in the non-volatile memory device 1100 may set an address scramble scheme of a cell string based on the address scramble selection information ASI.

Meanwhile, as another embodiment, the non-volatile memory device 1100 may directly set the address scramble scheme based on the detected word line delay information WDI. For example, the address scramble selector 1141 may store a mapping table associated with address scramble schemes corresponding to the word line delay information WDI. The address scramble selector 1141 may determine an address scramble scheme depending on the word line delay information WDI with reference to the mapping table.

As another embodiment, the non-volatile memory device 1100 may measure a program speed of each memory cell included in a cell string. The non-volatile memory device 1100 or the controller 1200 may determine an address scramble scheme based on the program speed of each memory cell.

Also, the controller 1200 may include a central processing unit, a working memory, a host interface, and a non-volatile memory interface. However, it should be appreciated that elements of the controller 1200 are not limited to the above-mentioned elements. For example, the controller 1200 may further include a read only memory (ROM) to store code data for an initial booting operation, an error correction unit (ECC) to correct erroneous data, a synchronous dynamic random access memory (SDRAM), etc.

The central processing unit may control overall operations of the controller 1200. For example, the central processing unit may be configured to drive firmware for controlling the controller 1200. The firmware may be loaded and driven on the working memory. The central processing unit may decode an instruction that is provided from a host. The central processing unit may control the non-volatile memory interface so as to execute a read or write access command included in the instruction.

The firmware for controlling the controller 1200 and data may be stored in the working memory. For example, the stored firmware and data may be driven by the central processing unit. The working memory may include at least one of a cache memory, a DRAM, a static RAM (SRAM), a phase-change RAM (PRAM), a ROM, and a flash memory. A flash translation layer (FTL) may be stored in the working memory. In the case of the non-volatile memory device 1100, a read/write unit and an erase unit may be different from each other. Accordingly, the flash translation layer (FTL) may need to manage a read/write/erase operation of the non-volatile memory device 1100.

The read/write operation of the non-volatile memory device 1100 may be performed in units of a page, and the erase operation thereof may be performed in units of a block. Due to the above-described characteristic of the non-volatile memory device 1100, there is a need to manage the read/write/erase operation of the non-volatile memory device 1100. The flash translation layer (FTL) is system software (or firmware) that is developed for such a purpose. The flash translation layer (FTL) may allow the non-volatile memory device 1100 to operate in response to an access (e.g., a read/write operation) that is requested from the host. The flash translation layer (FTL) may be driven by the central processing unit after being loaded on the working memory.

The host interface may provide an interface between the host and the controller 1200. The host and the controller 1200 may be connected through one of various standardized interfaces. Alternatively, the host and the controller 1200 may be connected through a plurality of interfaces of various standardized interfaces. Here, the standardized interfaces may include an advanced technology attachment (ATA) interface, a parallel ATA (PATA) interface, a serial ATA (SATA) interface, an external SATA (e-SATA) interface, a small computer small interface (SCSI), a serial attached SCSI (SAS), a peripheral component interconnection (PCI) interface, a PCI Express (PCI-E) interface, a universal serial bus (USB) interface, an IEEE 1394 interface, a non-volatile memory express (NVMe) interface, a card interface, etc.

The non-volatile memory interface may provide an interface between the controller 1200 and the non-volatile memory device 1100. The non-volatile memory interface may schedule a read/write/erase command of the non-volatile memory device 1100. The non-volatile memory interface may provide data from the host to the non-volatile memory device 1100 through a channel. Also, data read from the non-volatile memory device 1100 may be provided to the host through the non-volatile memory interface.

Figure 16:
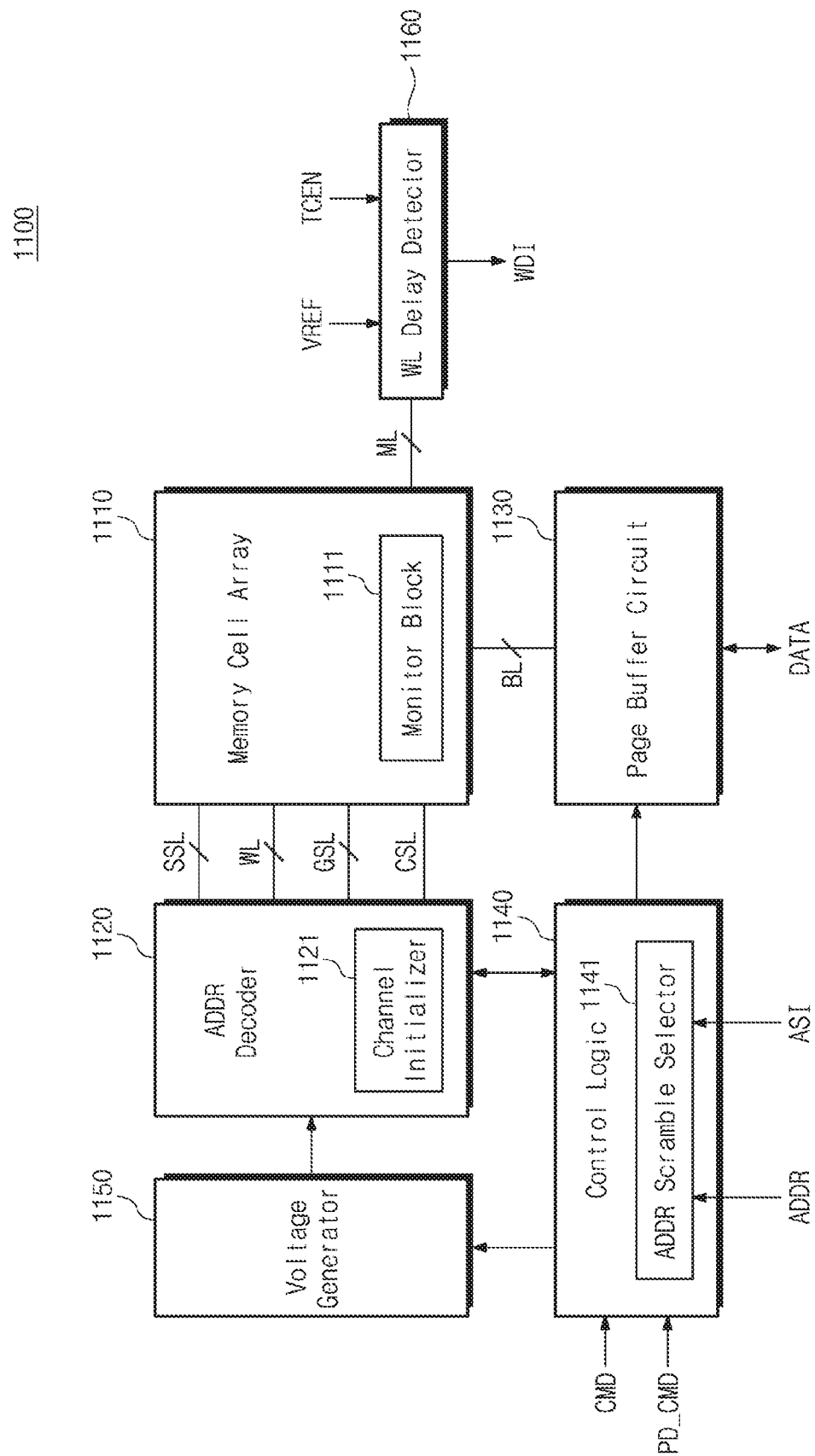
FIG. 16 is a block diagram illustrating the non-volatile memory device of FIG. 15.

FIG. 16 is a block diagram illustrating a non-volatile memory device 1100 of FIG. 15. Referring to FIG. 16, the non-volatile memory device 1100 may be the same as or similar to the non-volatile memory device 100 illustrated in FIG. 11 in configuration and characteristic, and a description thereof is thus omitted.

A memory cell array 1110 may include the monitor block 1111. For example, the monitor block 1111 may be specified upon manufacturing the non-volatile memory device 1100 to obtain characteristic information of a cell string. The monitor block 1111 may have the same structure as other memory blocks included in one memory chip. Accordingly, a channel hole profile of the monitor block 1111 may be used to set address scramble schemes of all memory blocks in a memory chip in which the monitor block 1111 is included.

The non-volatile memory device 1100 may receive the profile detection command PD_CMD from the controller 1200. If the profile detection command PD_CMD is received, the non-volatile memory device 1100 may obtain the characteristic information of the cell string by using the monitor block 1111. For example, the non-volatile memory device 1100 may program specified data in memory cells included in the monitor block 1111. The non-volatile memory device 1100 may measure a program speed of each memory cell included in the monitor block 1111. As described above, if a program speed is relatively fast, the size of a memory cell may be determined as being relatively small. The non-volatile memory device 1100 may obtain information about a program speed of each memory cell included in the monitor block 1111.

Meanwhile, the non-volatile memory device 1100 may obtain the characteristic information of the cell string by using the monitor block 1111 and a word line delay detector 1160. For example, the monitor block 1111 may be connected to word lines WL like other memory blocks. Also, the word lines WL of the monitor block 1111 may be respectively connected to the corresponding monitor lines ML. The monitor lines ML may be connected to the word line delay detector 1160. The monitor block 1111 may have an erase state by default.

If the profile detection command PD_CMD is received, control logic 1140 may control overall operations of the non-volatile memory device 1100 so as to generate the word line delay information WDI through the monitor block 1111. For example, the control logic 1140 may allow an address decoder 1120 to select the monitor block 1111. Also, the control logic 1140 may allow a voltage generator 1150 to generate a bias voltage to be applied to word lines connected to the monitor block 1111. The control logic 1140 may provide a word line delay detector 1160 with a reference voltage VREF and a count enable signal TCEN.

The word line delay detector 1160 may compare the reference voltage VREF with a voltage of each of the monitor lines respectively connected with the word lines WL and may generate the word line delay information WDI based on the comparison result. The word line delay information WDI may include a time needed to transfer the bias voltage through a word line connected to the monitor block 1111. The method for generating the word line delay information WDI will be described below with reference to FIG. 17.

As described above, the non-volatile memory device 1100 may obtain information about a program speed of each memory cell included in the monitor block 1111 or the word line delay information WDI of word lines connected to the monitor block 1111, in response to the profile detection command PD_CMD.

Figure 17:
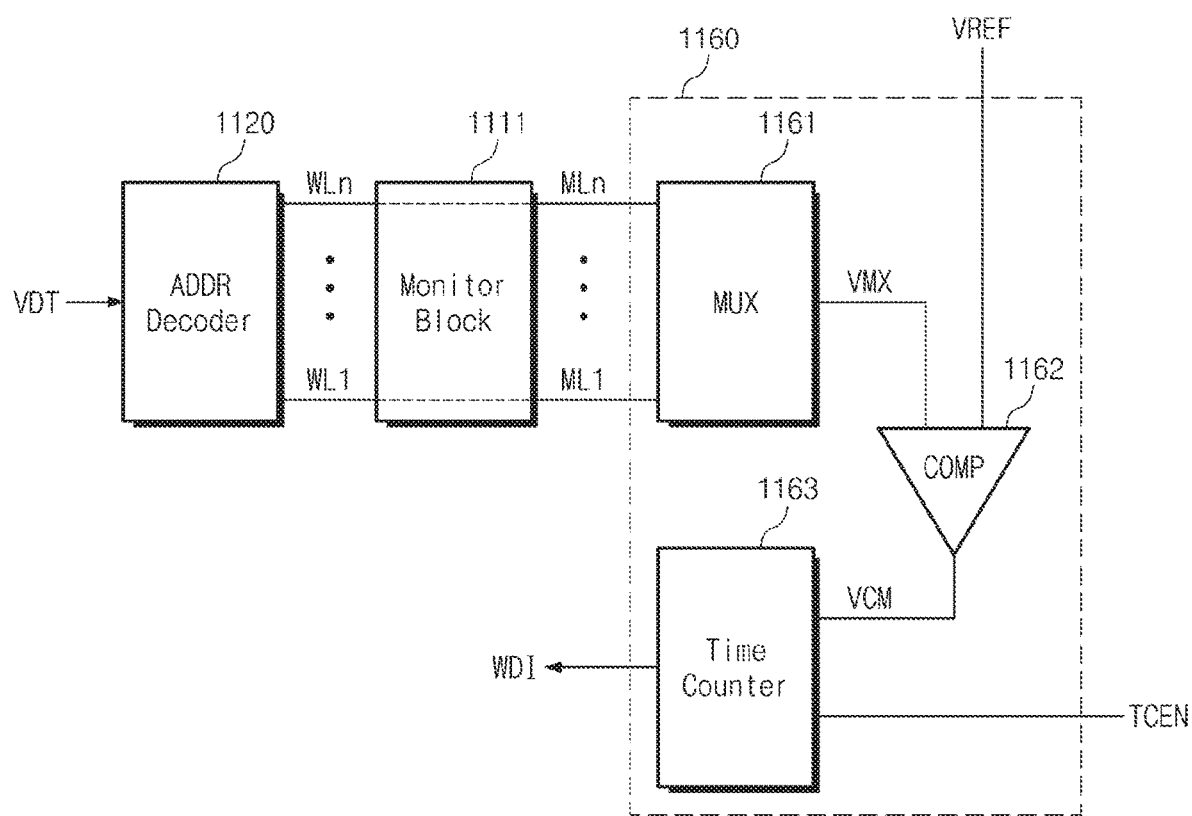
FIG. 17 is a block diagram illustrating an operation of a word line delay detector of FIG. 16.

FIG. 17 is a block diagram illustrating an operation of a word line delay detector of FIG. 16. Referring to FIGS. 16 and 17, the monitor block 1111 may be connected to the address decoder 1120 through first to n-th word lines WL1 to WLn. For example, the first to n-th word lines WL1 to WLn may be mapped onto memory cells included in a cell string of the monitor block 1111 in a specified order. The first to n-th word lines WL1 to WLn may be again mapped onto memory cells after an address scramble scheme is determined. The first to n-th word lines WL1 to WLn may be connected to the first to n-th monitor lines ML1 to MLn in a one-to-one correspondence.

The word line delay detector 1160 may include a multiplexer 1161, a comparator 1162, and a time counter 1163. For example, the multiplexer 1161 may be connected with the first to n-th monitor lines ML1 to MLn.

If the profile detection command PD_CMD is received, a bias voltage VDT may be provided to the address decoder 1120. In this case, the address decoder 1120 may select the first to n-th word lines one by one. Also, the multiplexer 1161 may select one of the first to n-th monitor lines ML1 to MLn in the same order as a word line. Accordingly, the bias voltage VDT may be output to the multiplexer 1161 through the selected word line. In this case, the control logic 1140 may activate the count enable signal TCEN, and the time counter 1163 may start to count in response to the count enable signal TCEN.

The comparator 1162 may compare an output voltage VMX of the multiplexer 1161 and the reference voltage VREF. For example, a voltage of a selected monitor line may be output as the output voltage VMX of the multiplexer 1161. A voltage of a selected monitor line may increase from a point in time when the bias voltage VDT is applied to the selected word line. The comparator 1162 may output a compare complete signal VCM when the output voltage VMX and the reference voltage VREF coincide with each other. The reference voltage VREF may be in advance set to a voltage that is equal to or smaller than the bias voltage VDT.

Accordingly, the time counter 1163 may measure a time from a point in time when the count enable signal TCEN is activated to a point in time when the compare complete signal VCM is received. The measured time may be output as the word line delay information WDI corresponding to the selected word line. A speed at which the output voltage VMX of the multiplexer 1161 increases may be inversely proportional to a resistance of the selected word line. If the resistance of the selected word line is great, the size of a memory cell connected to the selected word line is large. That is, it may be understood that the size of the memory cell connected to the selected word line becomes larger as the time measured by the time counter 1163 increases. Accordingly, the word line delay information WDI may correspond to the size of a channel hole of the memory cell connected to the selected word line.

With the above description, the non-volatile memory device 1100 or the controller 1200 may generate a channel hole profile based on the word line delay information WDI. Also, the non-volatile memory device 1100 or the controller 1200 may determine an address scramble scheme based on the generated channel hole profile. For example, the non-volatile memory device 1100 or the controller 1200 may select one of the address scramble schemes described with reference to FIGS. 4A to 4F.

Figure 18:
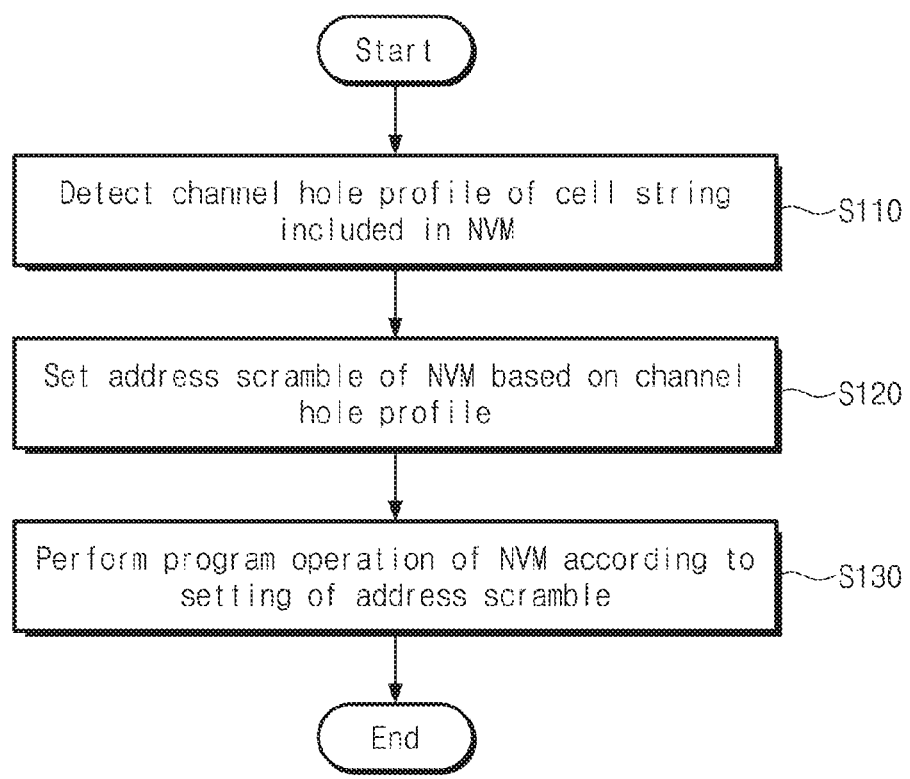
FIG. 18 is a flowchart illustrating a program method of the memory system according to an embodiment of the inventive concept.

FIG. 18 is a flowchart illustrating a program method of a memory system according to an embodiment of the inventive concept. Referring to FIGS. 15 and 18, the memory system 1000 may actively determine an address scramble scheme that will be used to perform a program operation depending on a shape of a cell string included in the non-volatile memory device 1100.

In operation S110, the memory system 1000 may detect a channel hole profile of a cell string included in the non-volatile memory device 1100. For example, the cell string profile detector 1210 included in the controller 1200 may issue the profile detection command PD_CMD to the non-volatile memory device 1100 in the first operation of the memory system 1000, or whenever it is necessary. The non-volatile memory device 1100 may obtain characteristic information of the cell string in response to the profile detection command PD_CMD. For example, the non-volatile memory device 1100 may include the monitor block 1111. The non-volatile memory device 1100 may measure a program speed of each memory cell included in the monitor block 1111. Alternatively, the non-volatile memory device 1100 may measure the word line delay information WDI of word lines connected to the monitor block 1111 through the word line delay detector 1160. The non-volatile memory device 1100 or the controller 1200 may generate the channel hole profile by using the measured program speed of the memory cells included in the monitor block 1111 or the measured word line delay information WDI.

In operation S120, the memory system 1000 may determine an address scramble scheme of the non-volatile memory device 1100 based on the detected channel hole profile. For example, the controller 1200 may receive information about the program speed of the memory cells included in the monitor block 1111 or the word line delay information WDI. The cell string profile detector 1210 of the controller 1200 may generate the address scramble selection information ASI by putting the program speed information or the word line delay information WDI together. The address scramble selector 1141 of the non-volatile memory device 1100 may receive the address scramble selection information ASI to set an address scramble scheme of a memory chip in which the monitor block 1111 is included.

As another embodiment, the non-volatile memory device 1100 may automatically set the address scramble scheme based on the program speed information or the word line delay information WDI. In this case, the address scramble selector 1141 may include a mapping table for determining an address scramble scheme.

Figure 19:
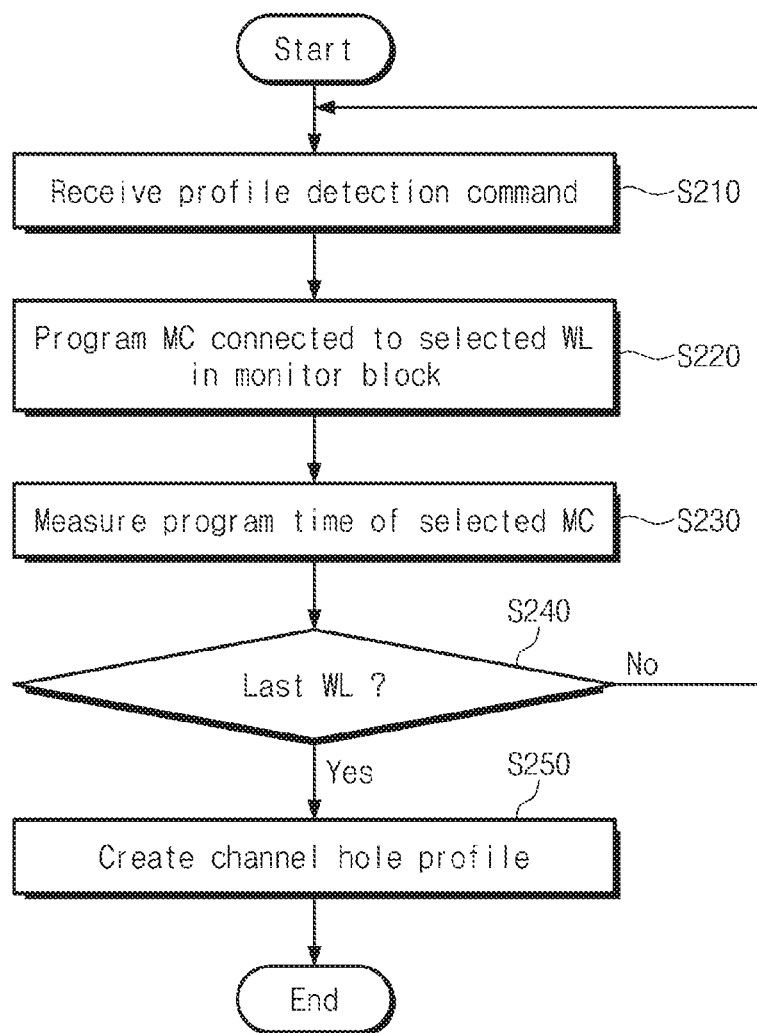
FIGS. 19 and 20 are flowcharts illustrating methods for detecting a channel hole profile of FIG. 18.
Figure 20:
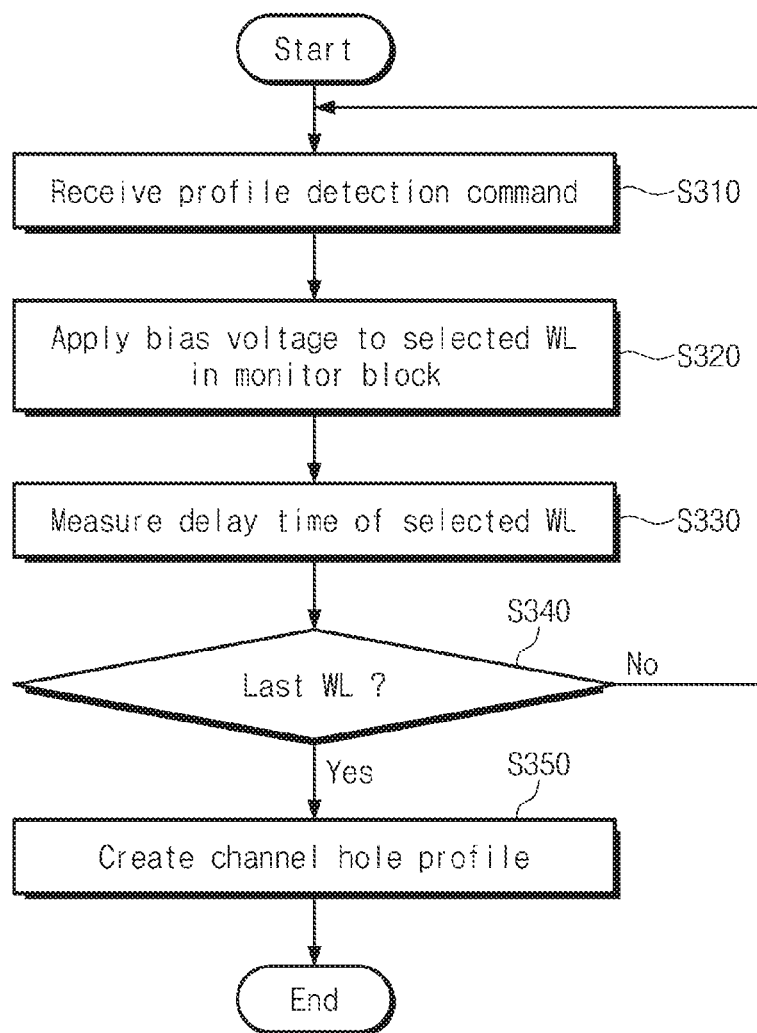

In operation S130, the memory system 1000 may perform a program operation depending on the set address scramble scheme. For example, the non-volatile memory device 1100 may program memory cells through the address scramble schemes described with reference to FIGS. 4A to 4F and the ways to perform program operations described with reference to FIGS. 5 to 14. As described above, the memory system 1000 according to an embodiment of the inventive concept may actively determine an address scramble scheme that will be used in programming FIGS. 19 and 20 are flowcharts illustrating methods for detecting a channel hole profile of FIG. 18. FIG. 19 shows a method for detecting a channel hole profile by using a program speed of memory cells included in the monitor block 1111. FIG. 20 shows a method for detecting a channel hole profile based on the result of measuring a time when a bias voltage is transferred to word lines connected to the monitor block 1111.

Referring to FIGS. 15 and 19, in operation S210, the non-volatile memory device 1100 may receive the profile detection command PD_CMD from the controller 1200. If the profile detection command PD_CMD is received, in operation S220, the non-volatile memory device 1100 may program a memory cell (i.e., a selected memory cell) connected to a selected word line in the monitor block 1111. For example, the non-volatile memory device 1100 may perform a program operation while selecting word lines connected to the monitor block 1111 in an order determined in advance. In operation S230, the non-volatile memory device 1100 may measure a program time of the selected memory cell. It may be possible to determine relative sizes between memory cells by measuring the program times of the memory cells. The reason is that a program time of a memory cell is proportional to the size of the memory cell. For example, the size of the memory cell may become relatively smaller as the program time of the memory cell becomes shorter.

In operation S240, the non-volatile memory device 1100 may determine whether the selected word line is the last word line connected to the monitor block 1111. That is, the non-volatile memory device 1100 may determine whether all memory cells included in the monitor block 1111 are programmed If the selected word line is the last word line, the process proceeds to operation S250. If the selected word line is not the last word line, the process proceeds to operation S210.

In operation S250, in the case where all word lines connected to the monitor block 1111 are selected according to a specified order (in the case where a program time of each of all memory cells of the monitor block 1111 is measured), the non-volatile memory device 1100 may generate a channel hole profile of a memory chip including the monitor block 1111, based on the measured program times. Alternatively, the non-volatile memory device 1100 may provide information about the measured program times to the controller 1200. The controller 1200 may generate the channel hole profile of the memory chip including the monitor block 1111, based on the measured program times.

Referring to FIGS. 15 and 20, in operation S310, the non-volatile memory device 1100 may receive the profile detection command PD_CMD from the controller 1200. If the profile detection command PD_CMD is received, in operation S320, the non-volatile memory device 1100 may apply a bias voltage to a word line selected in the monitor block 1111. For example, the monitor block 1111 may be set to an erase state, and a string selection transistor and a ground selection transistor may be turned on. The ground voltage GND may be applied to bit lines. In operation S330, the non-volatile memory device 1100 may measure a word line delay time, by which a transfer of the bias voltage is delayed, with respect to the selected word line. For example, the smaller the resistance of a word line, the shorter a word line delay time may be. Also, the smaller the size of a memory cell connected to a word line, the smaller the resistance of the word line may be. Accordingly, the word line delay time may be proportional to the size of the memory cell connected to the word line.

In operation S340, the non-volatile memory device 1100 may determine whether the selected word line is the last word line connected to the monitor block 1111. That is, the non-volatile memory device 1100 may determine whether a word line delay time is measured with respect to all word lines connected to the monitor block 1111. If the selected word line is the last word line, the process proceeds to operation S350. If the selected word line is not the last word line, the process proceeds to operation S310.

In operation S350, in the case where a word line delay time is measured with respect to all word lines connected to the monitor block 1111 according to a specified order, the non-volatile memory device 1100 may generate a channel hole profile of a memory chip including the monitor block 1111, based on the measured word line delay times. Alternatively, the non-volatile memory device 1100 may provide the controller 1200 with the word line delay information WDI associated with the measured word line delay times. In this case, the controller 1200 may generate the channel hole profile of the memory chip including the monitor block 1111, based on the word line delay information WDI.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of programming a three-dimensional (3D) nonvolatile memory device including a cell string, the cell string including a pillar structure comprising a ground selection transistor, a plurality of memory cells, and a string selection transistor stacked vertically over a substrate, wherein the memory cells comprise a first cell group and a second cell group stacked on the first cell group, and wherein a horizontal width of at least a portion of the pillar structure decreases in a depth direction towards the substrate, the method comprising:
   initializing a channel of a memory cell being selected of the first cell group of the cell string through the ground selection transistor; and then
   applying a program voltage to the memory cell of the pillar structure of the cell string.

2. The method of claim 1, further comprising sequentially executing said initializing and said applying for each of remaining memory cells of the first cell group of the cell string which are to be programmed among the memory cells of the first cell group of the cell string.

3. The method of claim 2, wherein a horizontal width of the pillar structure decreases in the depth direction from the string selection transistor to the ground selection transistor, and wherein the memory cells of the cell string are sequentially programmed in order from an uppermost memory cell furthest from the substrate to a lowermost memory cell closest to the substrate by sequentially executing said initializing and said applying for each of the memory cells of the cell string.

4. The method of claim 1, wherein a horizontal width of an uppermost memory cell of the first cell group is greater than a horizontal width of an adjacent lowermost memory cell of the second cell group, the method further including:
   sequentially programming the memory cells of the cell string in order from an uppermost memory cell of the second cell group furthest from the substrate to a lowermost memory cell of the first cell group closest to the substrate by sequentially executing said initializing and said applying for each of the memory cells of the cell string.

5. The method of claim 1, wherein a memory cell having a smallest horizontal width among the memory cells of the first cell group is programmed with fewer bits than a memory cell having a largest horizontal width of the memory cells of the first cell group.

6. The method of claim 1, wherein a memory cell having a smallest horizontal width among the memory cells of the second cell group is programmed with fewer bits than a memory cell having a largest horizontal width of the memory cells of the second cell group.

7. The method of claim 1, wherein the method includes incremental step pulse programming (ISPP) comprising a plurality of program loops, and wherein a second program operation for programming the memory cell during a first portion of the program loops is different from a fourth program operation for programming the memory cell during a second portion of the program loops, wherein a voltage applied to a common source line of the cell string is different between the second and fourth program operations.

8. A three dimensional non-volatile memory device, comprising:
   a memory cell array including a cell string, the cell string including a pillar structure comprising a ground selection transistor, a plurality of memory cells, and a string selection transistor stacked vertically over a substrate, wherein the memory cells comprise a first cell group and a second cell group stacked on the first cell group, and wherein a horizontal width of at least a portion of the pillar structure decreases in a depth direction towards the substrate;
   an address decoder configured to a supply string selection line voltage to the string selection transistor, word line voltages to word lines connected to the memory cells, a ground selection line voltage to the ground selection transistor, and a common source line voltage to a common source line of the memory cell array;
   a page buffer circuit configured to output bit data from selected ones of the memory cells of the memory cell array;
   control logic; and
   a voltage generator configured to supply voltages to the address decoder in response to the control logic,
   wherein the memory device is configured to initialize a channel of a memory cell being selected of the first cell group of the cell string through the ground selection transistor, and then apply a program voltage to the memory cell of the pillar structure of the cell string.

9. The memory device of claim 8, wherein the memory device is configured to sequentially initialize the channel through the ground selection transistor, and then apply the program voltage, for each of remaining memory cells of the first cell group of the cell string which are to be programmed among the memory cells of the first cell group of the cell string.

10. The memory device of claim 9, wherein a horizontal width of the pillar structure decreases in the depth direction from the string selection transistor to the ground selection transistor, and wherein the memory device is configured to sequentially program the memory cells of the cell string in order from an uppermost memory cell furthest from the substrate to a lowermost memory cell closest to the substrate by sequentially initializing the channel through the ground selection transistor, and then applying the program voltage, for each of the memory cells of the cell string.

11. The memory device of claim 8, wherein a horizontal width of an uppermost memory cell of the first cell group is greater than a horizontal width of an adjacent lowermost memory cell of the second cell group, and wherein the memory device is configured to:
   sequentially program the memory cells of the cell string in order from an uppermost memory cell of the second cell group furthest from the substrate to a lowermost memory cell of the first cell group closest to the substrate by sequentially initializing the channel through the ground selection transistor, and then applying the program voltage for each of the memory cells of the cell string.

12. The memory device of claim 8, wherein the memory device is configured to program a memory cell having a smallest horizontal width among the memory cells of the first cell group with fewer bits than a memory cell having a largest horizontal width of the memory cells of the first cell group.

13. The memory device of claim 8, wherein a memory cell having a smallest horizontal width among the memory cells of the second cell group is programmed with fewer bits than a memory cell having a largest horizontal width of the memory cells of the second cell group.

14. The memory device of claim 8, wherein the memory device is configured to program the memory cell using incremental step pulse programming (ISPP) comprising a plurality of program loops, and wherein a second program operation for programming the memory cell during a first portion of the program loops is different from a fourth program operation for programming the memory cell during a second portion of the program loops, wherein a voltage applied to a common source line of the selected memory string is different between the second and fourth program operations.

15. A method of programming a three-dimensional (3D) nonvolatile memory device, including a memory cell array having a plurality of cell strings each connected to one of a plurality of bit lines, the cell strings each including a pillar structure comprising a ground selection transistor, a plurality of memory cells each connected to one of a plurality of word lines, and a string selection transistor stacked vertically over a substrate, wherein the memory cells of each cell string comprise a first cell group and a second cell group stacked on the first cell group, and wherein a horizontal width of at least a portion of the pillar structure decreases in a depth direction towards the substrate, the method comprising:
- providing bit line voltages to the bit lines to select one of the bit lines;
- supplying string selection line voltages to string selection transistors of cell strings connected to the selected bit line to select one of the cell strings; and
- precharging the pillar structure of the selected cell string through the ground selection transistor of the selected cell string, and then applying word line voltages to the word lines connected to the memory cells of the cell string to program a selected memory cell.

16. The method of claim 15, further comprising sequentially executing said providing, supplying, precharging and applying for each of remaining memory cells of the selected cell string which are to be programmed among the memory cells of the selected cell string.

17. The method of claim 16, wherein a horizontal width of the pillar structure decreases in the depth direction from the string selection transistor to the ground selection transistor, and wherein the memory cells of the cell string are sequentially programmed in order from an uppermost memory cell furthest from the substrate to a lowermost memory cell closest to the substrate by sequentially executing said providing, supplying, precharging and applying for each of the memory cells of the cell string.

18. The method of claim 15, wherein a horizontal width of an uppermost memory cell of the first cell group is greater than a horizontal width of an adjacent lowermost memory cell of the second cell group, the method further including:
- sequentially programming the memory cells of the cell string in order from an uppermost memory cell of the second cell group furthest from the substrate to a lowermost memory cell of the first cell group closest to the substrate by sequentially executing said initializing and said applying for each of the memory cells of the cell string.

19. The method of claim 15, wherein a memory cell having a smallest horizontal width among the memory cells of the second cell group is programmed with fewer bits than a memory cell having a largest horizontal width of the memory cells of the second cell group.

20. The method of claim 15, wherein the method of programming the memory cell includes incremental step pulse programming (ISPP) comprising a plurality of program loops, and wherein a second program operation for programming the memory cell during a first portion of the program loops is different from a fourth program operation for programming the memory cell during a second portion of the program loops, wherein a voltage applied to a common source line of the cell string is different between the second and fourth program operations.

* * * * *